US012610522B2

(12) United States Patent
Xiao et al.

(10) Patent No.: US 12,610,522 B2
(45) Date of Patent: Apr. 21, 2026

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei City (CN)

(72) Inventors: Deyuan Xiao, Hefei City (CN); Yi Jiang, Hefei City (CN); Guangsu Shao, Hefei City (CN); Xingsong Su, Hefei City (CN); Yunsong Qiu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 800 days.

(21) Appl. No.: 17/940,923

(22) Filed: Sep. 8, 2022

(65) Prior Publication Data

US 2023/0005919 A1 Jan. 5, 2023

Related U.S. Application Data

(63) Continuation of application No. PCT/CN2022/096758, filed on Jun. 2, 2022.

(30) Foreign Application Priority Data

May 20, 2022 (CN) .......................... 202210550340.6

(51) Int. Cl.
*H10B 12/00* (2023.01)
(52) U.S. Cl.
CPC ........... *H10B 12/30* (2023.02); *H10B 12/488* (2023.02)

(58) Field of Classification Search
CPC .... H10B 12/34; H10B 12/395; H10B 12/315; H10B 12/482; H10B 12/488
See application file for complete search history.

(56) References Cited

U.S. PATENT DOCUMENTS

2009/0166872 A1* 7/2009 Chung ................... H10B 12/09
257/E23.164
2012/0119286 A1 5/2012 Kim
(Continued)

FOREIGN PATENT DOCUMENTS

CN 100561740 C 11/2009
CN 102522407 A 6/2012
(Continued)

OTHER PUBLICATIONS

International Search Report for Application No. PCT/CN2022/096424 mailed on Dec. 29, 2022.
(Continued)

*Primary Examiner* — Jay C Kim
*Assistant Examiner* — John Lin
(74) *Attorney, Agent, or Firm* — Syncoda LLC; Feng Ma

(57) ABSTRACT

A semiconductor structure and a method for forming a semiconductor structure are provided. The semiconductor structure includes: a substrate, multiple active pillars located in the substrate, and multiple word lines. The multiple active pillars are arranged in an array in a first direction and a second direction. The first direction and the second direction are both directions parallel to a top surface of the substrate, and the first direction and the second direction intersect. The multiple word lines are spaced apart in the first direction. Each of the word lines extends in the second direction and continuously surrounds and covers a portion of a side wall of each of the multiple active pillars arranged in the second direction. Any two adjacent word lines are at least partially (Continued)

staggered in a direction perpendicular to the top surface of the substrate.

6 Claims, 26 Drawing Sheets

(56)                    References Cited

U.S. PATENT DOCUMENTS

| | | | |
|---|---|---|---|
| 2013/0234242 A1* | 9/2013 | Hwang | .............. H10D 84/0165 |
| | | | 438/270 |
| 2020/0295008 A1 | 9/2020 | Tang et al. | |
| 2021/0074334 A1 | 3/2021 | Zhu | |
| 2021/0074705 A1 | 3/2021 | Tang et al. | |

FOREIGN PATENT DOCUMENTS

| | | | |
|---|---|---|---|
| CN | 109285838 A | 1/2019 |
| CN | 114023703 A | 2/2022 |
| CN | 114141712 A | 3/2022 |
| CN | 114156236 A | 3/2022 |
| WO | 2013091374 A1 | 6/2013 |

OTHER PUBLICATIONS

Written Opinion for Application No. PCT/CN2022/096424 mailed on Dec. 29, 2022.
International Search Report for Application No. PCT/CN2022/096758 mailed on Dec. 16, 2022.
Written Opinion for Application No. PCT/CN2022/096758 mailed on Dec. 16, 2022.

* cited by examiner

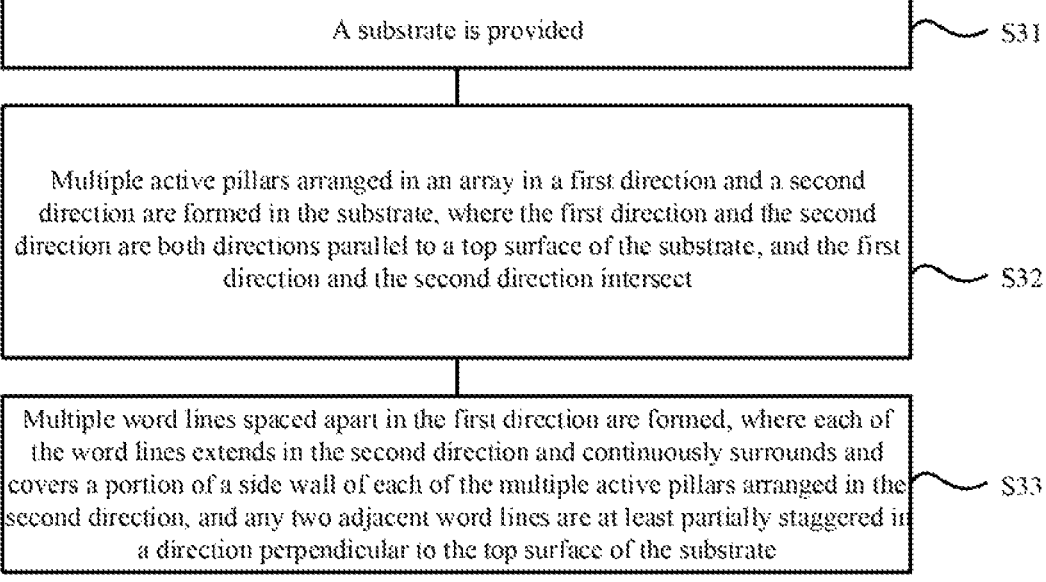

A substrate is provided — S31

Multiple active pillars arranged in an array in a first direction and a second direction are formed in the substrate, where the first direction and the second direction are both directions parallel to a top surface of the substrate, and the first direction and the second direction intersect — S32

Multiple word lines spaced apart in the first direction are formed, where each of the word lines extends in the second direction and continuously surrounds and covers a portion of a side wall of each of the multiple active pillars arranged in the second direction, and any two adjacent word lines are at least partially staggered in a direction perpendicular to the top surface of the substrate — S33

FIG. 3

SEMICONDUCTOR STRUCTURE AND METHOD FOR FORMING SEMICONDUCTOR STRUCTURE

CROSS-REFERENCE TO RELATED APPLICATIONS

This is a continuation of International Patent Application No. PCT/CN2022/0%758 filed on Jun. 2, 2022, which claims priority to Chinese Patent Application No. 202210550340.6 filed on May 20, 2022. The disclosures of these applications are hereby incorporated by reference in their entirety.

BACKGROUND

A Dynamic Random Access Memory (DRAM) is a semiconductor device commonly used in electronic devices such as computers, and is composed of multiple storage units. Each storage unit typically includes a transistor and a capacitor. The transistor has a gate electrically connected to a word line, a source electrically connected to a bit line, and a drain electrically connected to the capacitor. A word line voltage on the word line can control the turn-on and turn-off of the transistor, so that data information stored in the capacitor can be read or written into the capacitor through the bit line.

However, in a semiconductor structure such as a DRAM, all word lines are located at a same level, and the coupling effect between adjacent word lines is strong because the spacing between adjacent word lines is narrow. When one word line is selected to be turned on, the adjacent word lines will be turned on instantaneously due to the strong coupling effect, which may eventually cause capacitance leakage or even read and write failure, thereby seriously affecting the performance of the memory.

Therefore, how to reduce the coupling effect between adjacent word lines so as to improve the performance of the memory is currently an urgent technical problem to be solved.

SUMMARY

The disclosure relates to the technical field of semiconductor manufacturing, and more particularly, to a semiconductor structure and a method for forming a semiconductor structure.

According to a first aspect of disclosure, there is provided a semiconductor structure, including: a substrate, multiple active pillars located in the substrate, and multiple word lines. The multiple active pillars are arranged in an array in a first direction and a second direction. The first direction and the second direction are both directions parallel to a top surface of the substrate, and the first direction and the second direction intersect. The multiple word lines are spaced apart in the first direction. Each of the word lines extends in the second direction and continuously surrounds and covers a portion of a side wall of each of the multiple active pillars arranged in the second direction. Any two adjacent word lines are at least partially staggered in a direction perpendicular to the top surface of the substrate.

According to a second aspect of the disclosure, there is provided a method for forming a semiconductor structure, including the following operations. A substrate is provided. Multiple active pillars arranged in an array in a first direction and a second direction are formed in the substrate, where the first direction and the second direction are both directions parallel to a top surface of the substrate, and the first direction and the second direction intersect. Multiple word lines spaced apart in the first direction are formed, each of the word lines extending in the second direction and continuously surrounding and covering a portion of a side wall of each of the multiple active pillars arranged in the second direction, and any two adjacent word lines being at least partially staggered in a direction perpendicular to the top surface of the substrate.

BRIEF DESCRIPTION OF THE DRAWINGS

FIG. 3 is a flowchart of a method for forming a semiconductor structure in a specific implementation of the disclosure.

DETAILED DESCRIPTION

The specific implementations of a semiconductor structure and a method for forming a semiconductor structure provided in the disclosure will be described in detail below with reference to the drawings.

Figure 1:
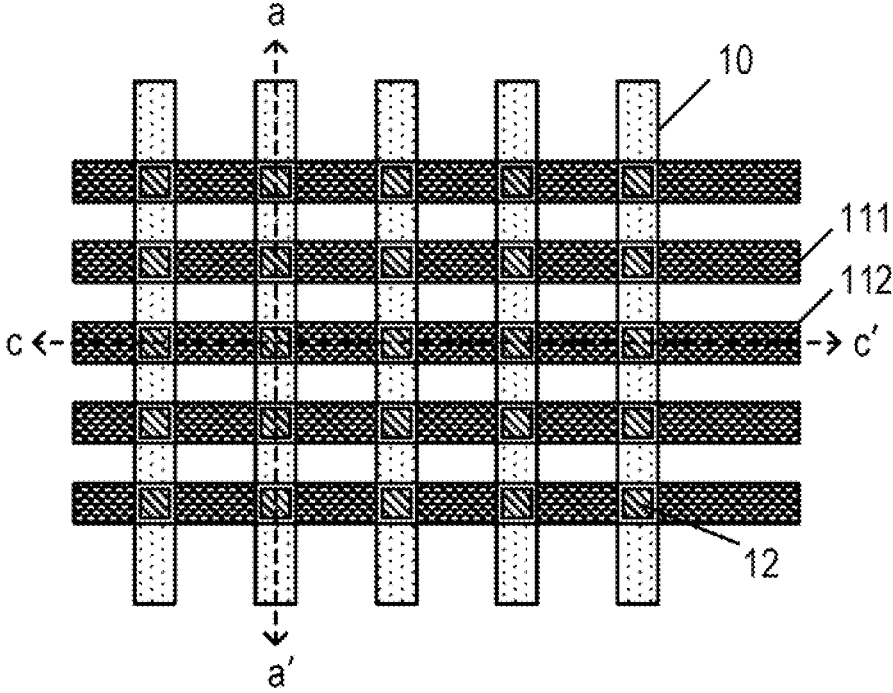
FIG. 1 is a schematic top view of a semiconductor structure in a specific implementation of the disclosure.
Figure 2:
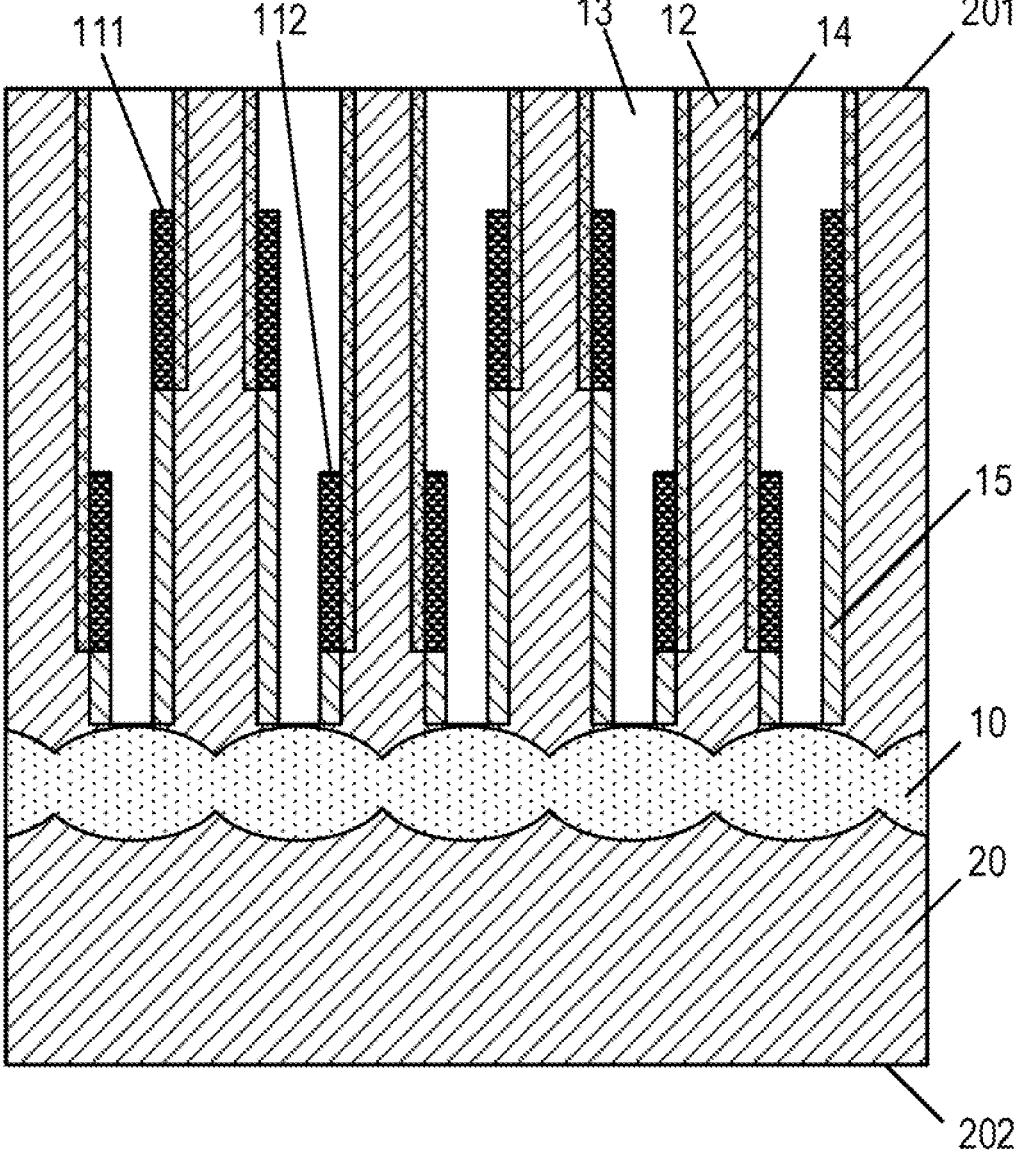
FIG. 2 is a schematic cross-sectional view of a semiconductor structure in a specific implementation of the disclosure.

This specific implementation provides a semiconductor structure. FIG. 1 is a schematic top view of a semiconductor structure in a specific implementation of the disclosure. FIG. 2 is a schematic cross-sectional view of a semiconductor structure in a specific implementation of the disclosure. FIG. 2 is a schematic cross-sectional view taken in a direction a-a' of FIG. 1. The semiconductor structure in this specific implementation may be, but is not limited to, a memory such as a DRAM. As shown in FIGS. 1 and 2, the semiconductor structure includes: a substrate 20, multiple active pillars 12 and multiple word lines. The multiple active pillars 12 are located in the substrate 20. The multiple active pillars 12 are arranged in an array in a first direction and a second direction. The first direction a-a' and the second direction c-c' are both directions parallel to a top surface 201 of the substrate 20, and the first direction a-a' and the second direction c-c' intersect. The multiple word lines are spaced apart in the first direction a-a'. Each of the word lines extends in the second direction c-c' and continuously surrounds and covers a portion of a side wall of each of the multiple active pillars 12 arranged in the second direction c-c'. Any two adjacent word lines are at least partially staggered in a direction perpendicular to the top surface 201 of the substrate 20.

For example, the substrate 20 may be, but is not limited to, a silicon substrate. This specific implementation will be described by taking the substrate being a silicon substrate as an example. In other embodiments, the substrate 20 may also be a semiconductor substrate such as gallium nitride substrate, gallium arsenide substrate, gallium carbide substrate, silicon carbide substrate, or SOI substrate. The substrate 20 includes the top surface 201, and a bottom surface 202 opposite to the top surface. The multiple active pillars 12 are arranged in an array in the substrate 20 in the first direction a-a' and the second direction c-c'. Each of the active pillars 12 extends in the direction perpendicular to the top surface 201 of the substrate 20. The multiple word lines are all located inside the substrate 20. Each of the word lines extends in the second direction c-c' and continuously surrounds and covers a portion of a side wall of each of the multiple active pillars 12 arranged in the second direction c-c'. The multiple word lines are spaced apart in the first direction a-a'. The intersection may be a vertical intersection or an inclined intersection. This specific implementation will be described with reference to the intersection being a vertical intersection.

According to this specific implementation, any two adjacent word lines are at least partially staggered in the direction perpendicular to the top surface 201 of the substrate 20 such that any two adjacent word lines are at different levels, thereby reducing the facing area between any two adjacent word lines, so as to reduce the effect of capacitive coupling between any two adjacent word lines. Therefore, when one of the two adjacent word lines is selected to be turned on, the other word line is not turned on due to the effect of capacitive coupling, so as to reduce or even avoid electric leakage problems between adjacent storage units, thereby improving the electrical performance of the semiconductor structure.

In some embodiments, some of the multiple word lines are first word lines 111 and some of the multiple word lines are second word lines 112. As for the multiple active pillars 12 arranged in the first direction a-a', the first word line 111 surrounds and covers a portion of the side wall of the active pillar 12 in a first parity sequence and the second word line 112 surrounds and covers a portion of side wall of the active pillar 12 in a second parity sequence.

For example, the first parity sequence may be an odd sequence and the second parity sequence may be an even sequence. Accordingly, the operation that the first word line 111 surrounds and covers a portion of the side wall of the active pillar 12 in the first parity sequence and the second word line 112 surrounds and covers a portion of the side wall of the active pillar 12 in the second parity sequence means that, after sequentially ordering the multiple active pillars 12 arranged in the first direction a-a', a portion of the side wall of the active pillar 12 located at an odd position is surrounded and covered by the first word line 111, and a portion of the side wall of the active pillar 12 located at an even position is surrounded and covered by the second word line 112. The first word line 111 and the second word line 112 are at least partially staggered in the direction perpendicular to the top surface 201 of the substrate 20. Of course, the first parity sequence may also be an even sequence and the second parity sequence may also be an odd sequence. For example, projections of the first word lines 111 in the direction perpendicular to the top surface 201 of the substrate 20 may be alternated with projections of the second word lines 112 in the direction perpendicular to the top surface 201 of the substrate 20, thereby helping to simplify the formation process of the word lines and reducing the difficulty of manufacturing the semiconductor structure.

In some embodiments, a top surface of the first word line 111 is located below a bottom surface of the second word line 112; or, a top surface of the first word line 111 is located above a bottom surface of the second word line 112, and the top surface of the first word line 111 is located below a top surface of the second word line 112.

For example, in some embodiments, the top surface of the first word line 111 is located below the bottom surface of the second word line 112, i.e. the first word line 111 and the second word line 112 are completely staggered in the direction perpendicular to the top surface 201 of the substrate 20, so that the first word line 111 and the second word line 112 do not overlap at all in the direction perpendicular to the top surface 201 of the substrate 20, thereby minimizing the effect of capacitive coupling between the first word line 111 and the second word line 112 adjacent thereto. In other embodiments, the top surface of the first word line 111 is located above the bottom surface of the second word line 112, and the top surface of the first word line 111 is located below the top surface of the second word line 112, i.e. the first word line 111 and the second word line 112 are partially staggered in the direction perpendicular to the top surface 201 of the substrate 20, so that the first word line 111 and the second word line 112 partially overlap in the direction perpendicular to the top surface 201 of the substrate 20, thereby helping to reduce the size of the semiconductor structure while reducing the effect of capacitive coupling between the first word line 111 and the second word line 112 adjacent thereto.

In some embodiments, the multiple word lines are equal in size in the direction perpendicular to the top surface 201 of the substrate 20.

For example, in the direction perpendicular to the top surface 201 of the substrate 20, all of the first word lines 111 are equal in size, all of the second word lines 112 are equal in size, and any one of the first word lines 111 is equal in size to any one of the second word lines 112. By controlling the sizes of all of the word lines to be equal, the internal resistances of all of the word lines can be controlled to be equal, thereby simplifying the control operation of the semiconductor structure.

When the first word line 111 and the second word line 112 do not overlap at all in the direction perpendicular to the top surface 201 of the substrate 20, a width of a preset gap between the top surface of the first word line 111 and the bottom surface of the second word line 112 should not be too large, otherwise the size and manufacture cost of the semiconductor structure will be increased. In some embodiments, a top surface of the first word line Ill is located below a bottom surface of the second word line 112, a preset gap is provided between the top surface of the first word line 111 and the bottom surface of the second word line 112, and a width of the preset gap is ¼ to ½ of a size of the first word line 111 in the direction perpendicular to the top surface 201 of the substrate 20. Here, the size of the first word line 111 may be a height of the first word line 111 in the direction perpendicular to the top surface 201 of the substrate 20.

In some embodiments, each of the active pillars 12 includes a source region, a channel region and a drain region sequentially arranged in the direction perpendicular to the top surface 201 of the substrate 20. Each of the word lines continuously surrounds and covers the channel regions of the multiple active pillars 12 arranged in the second direction c-c'. The semiconductor structure further includes: multiple bit lines 10 located in the substrate 20. The multiple bit lines 10 are spaced apart in the second direction c-c'. Each of the bit lines 10 extends in the first direction a-a' and is in contact with and electrically connected to the source regions of the multiple active pillars 12 arranged in the first direction a-a'.

For example, as shown in FIGS. 1 and 2, the multiple bit lines 10 are included in the substrate 20, and the bit lines 10 are located below the word lines. Each of the bit lines 10 extends in the first direction a-a', and the multiple bit lines
10 are spaced apart in the second direction c-c'. Each of the
bit lines 10 is in contact with and electrically connected to
the source regions of the multiple active pillars 12 arranged
in the first direction a-a'.

In some embodiments, the semiconductor structure fur-
ther includes: an insulating layer 15, a gate dielectric layer
14 and an isolating layer 13. The insulating layer covers a
side wall of the source region. The gate dielectric layer
covers a side wall of the channel region and a side wall of
the drain region. The word line is located on a surface of the
gate dielectric layer 14 on the channel region. The isolating
layer is located between the adjacent active pillars 12 and
covers a surface of the insulating layer 15, a surface of the
word line and a surface of the gate dielectric layer 14 on the
side wall of the drain region.

For example, the isolating layer 13 is configured to
electrically isolate the adjacent word lines. For example, the
first word line 111 and the second word line 112 adjacent in
the first direction a-a' are electrically isolated by the isolating
layer 13. The material of the isolating layer 13 may be, but
is not limited to, a nitride material, such as silicon nitride.
The insulating layer 15 covers the side wall of the source
region and a portion of the top surface of the bit line 10, the
isolating layer 13 covers the surface of the insulating layer
15 and a portion of the top surface of the bit line 10, and the
word line and the bit line 10 are electrically isolated by the
insulating layer 15 and the isolating layer 13. The material
of the insulating layer 15 may be, but is not limited to, an
oxide material, such as silicon dioxide.

This specific implementation will be described by taking
some of the multiple word lines being first word lines and
some of the multiple word lines being second word lines as
an example. In other specific implementations, some of the
multiple word lines are first word lines, some of the word
lines are second word lines, and some of the word lines are
third word lines. For the multiple active pillars 12 arranged
in the first direction, the first word line surrounds and covers
a portion of the side wall of the active pillar 12 at a (3n)-th
position, the second word line surrounds and covers a
portion of the side wall of the active pillar 12 at a (3n+1)-th
position, and the third word line surrounds and covers a
portion of the side wall of the active pillar 12 at a (3n+2)-th
position, where n is an integer greater than or equal to 0.

For example, in other specific implementations, the first
word lines, the second word lines and the third word lines
are provided, the first word lines, the second word lines and
the third word lines are arranged alternately in the first
direction, any two of the first word line, the second word line
and the third word line are at least partially staggered in the
direction perpendicular to the top surface 201 of the sub-
strate 20, i.e. the first word line, the second word line and the
third word line have different levels in the direction perpen-
dicular to the top surface 201 of the substrate 20. By
arranging the first word line, the second word line and the
third word line at different levels, the integration of the
semiconductor structure is improved while reducing the
coupling effect between the word lines on the adjacent active
pillars 12.

Figure 4:
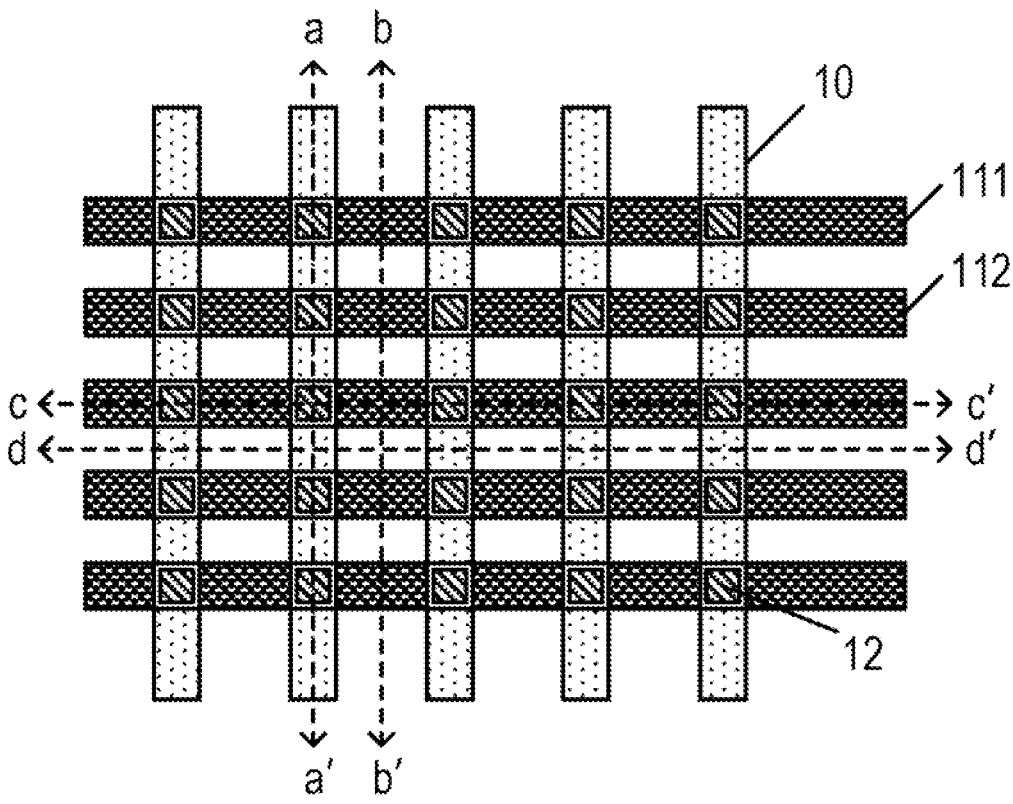
FIG. 4 is a schematic top view of a semiconductor structure formed by a specific implementation of the disclosure.
Figure 5A:
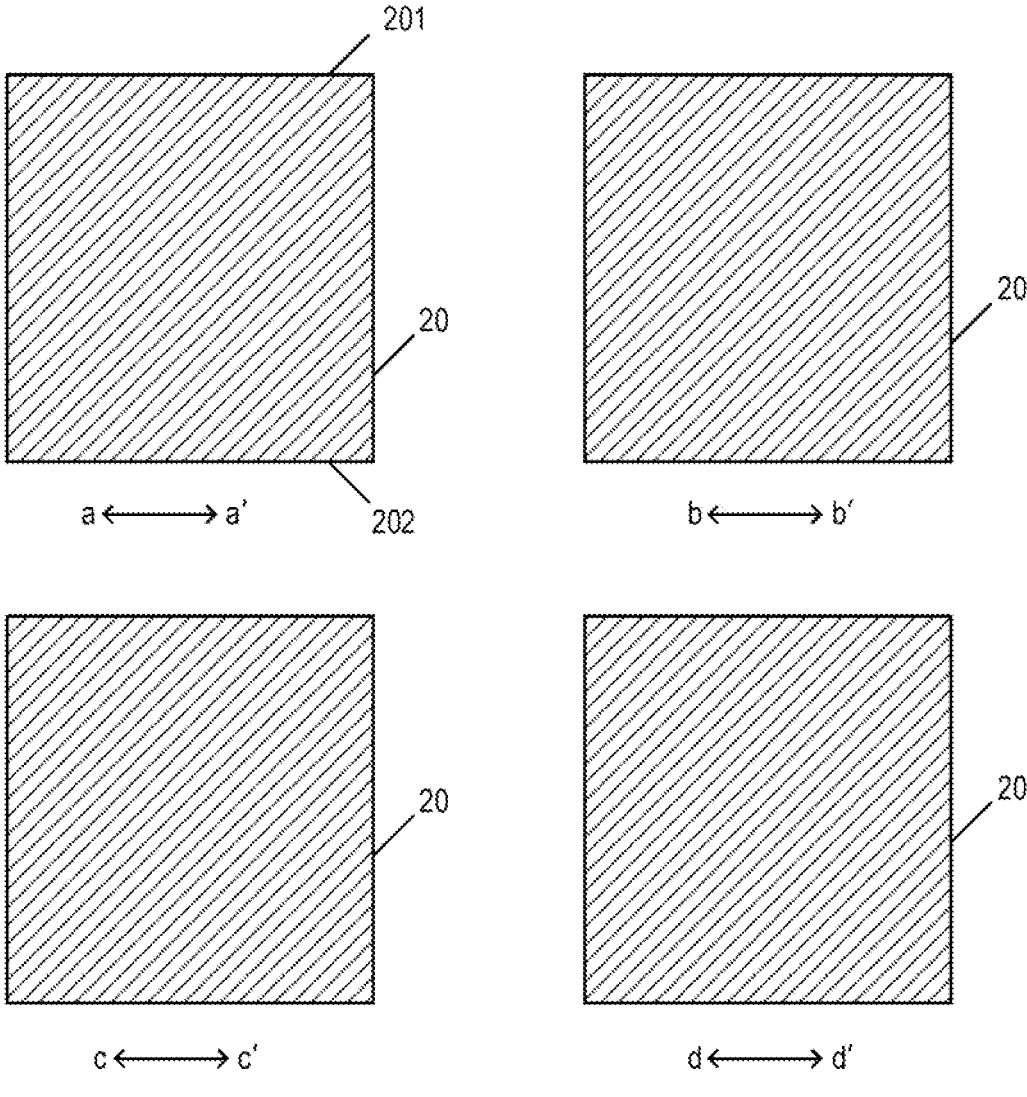
FIGS. 5A-SN are schematic views of a principal process in forming a semiconductor structure according to an embodiment of a specific implementation of the disclosure.
Figure 5B:
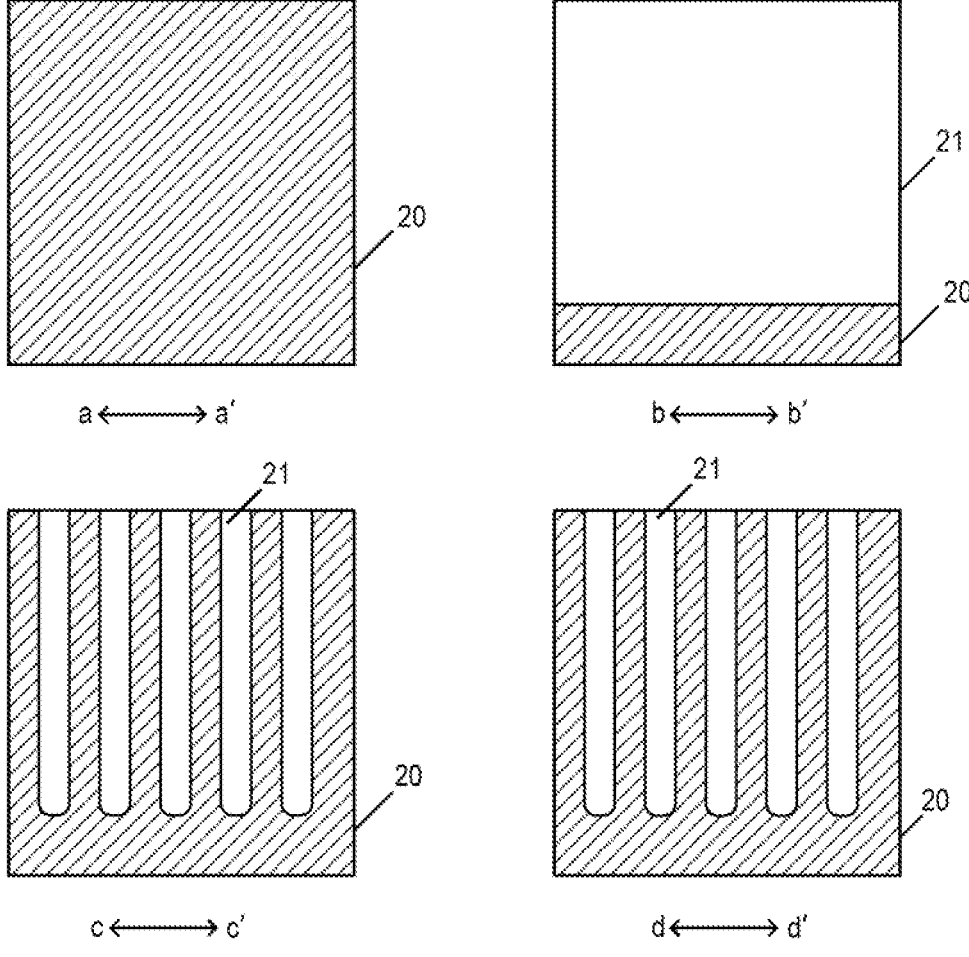
Figure 5C:
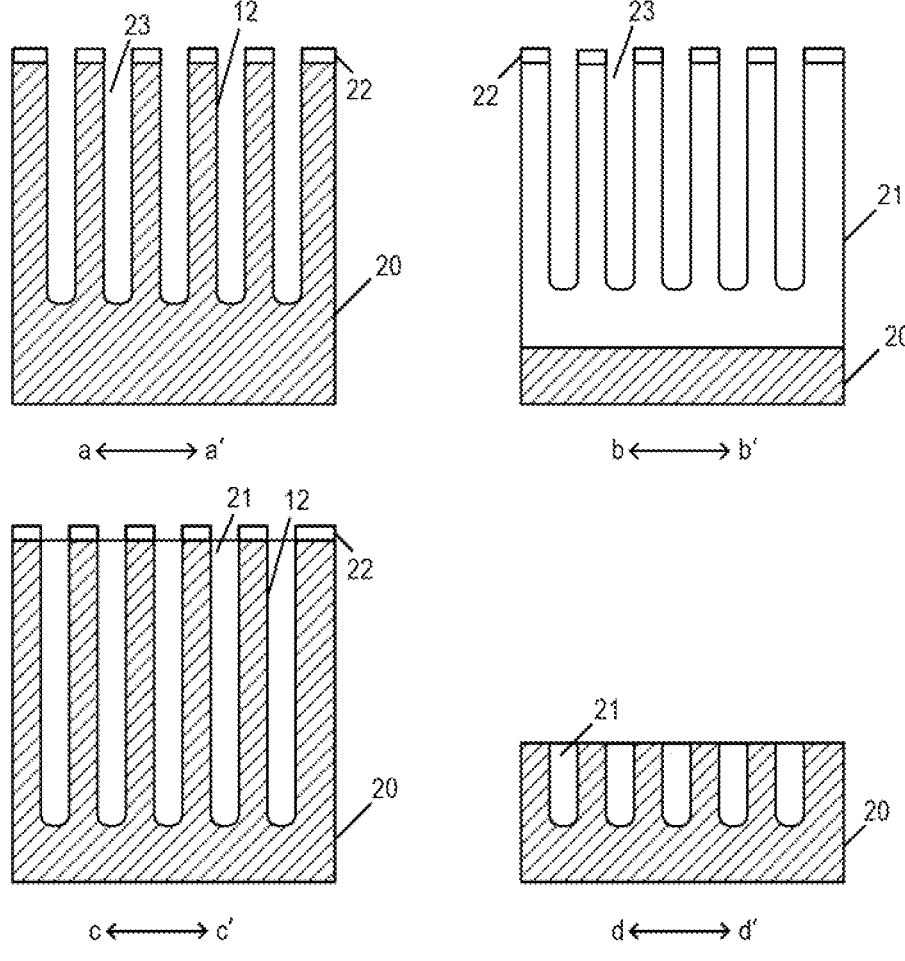
Figure 5D:
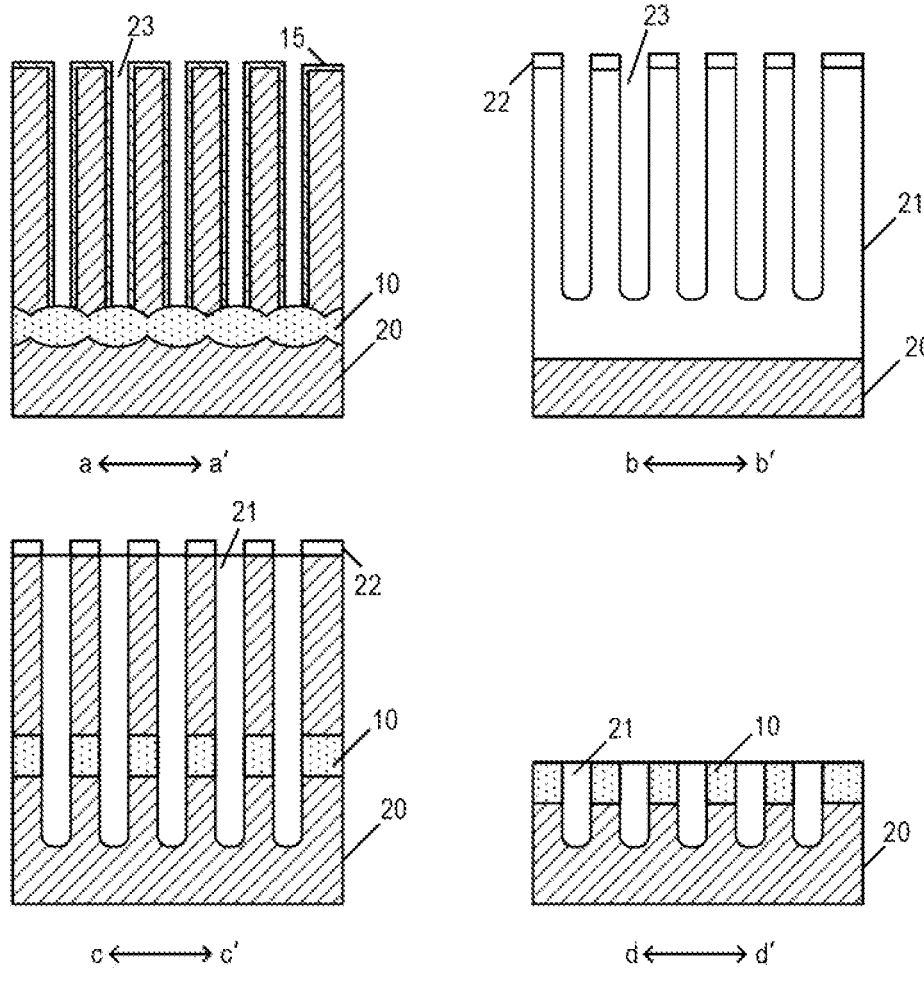
Figure 5E:
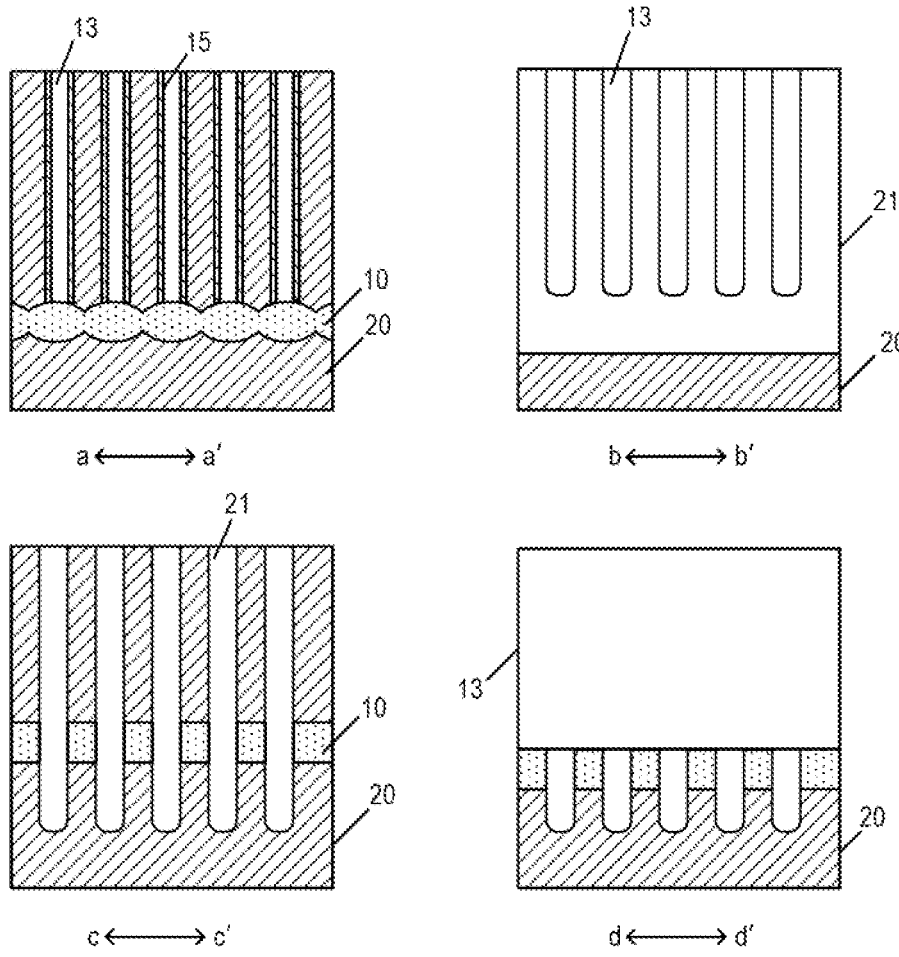
Figure 5F:
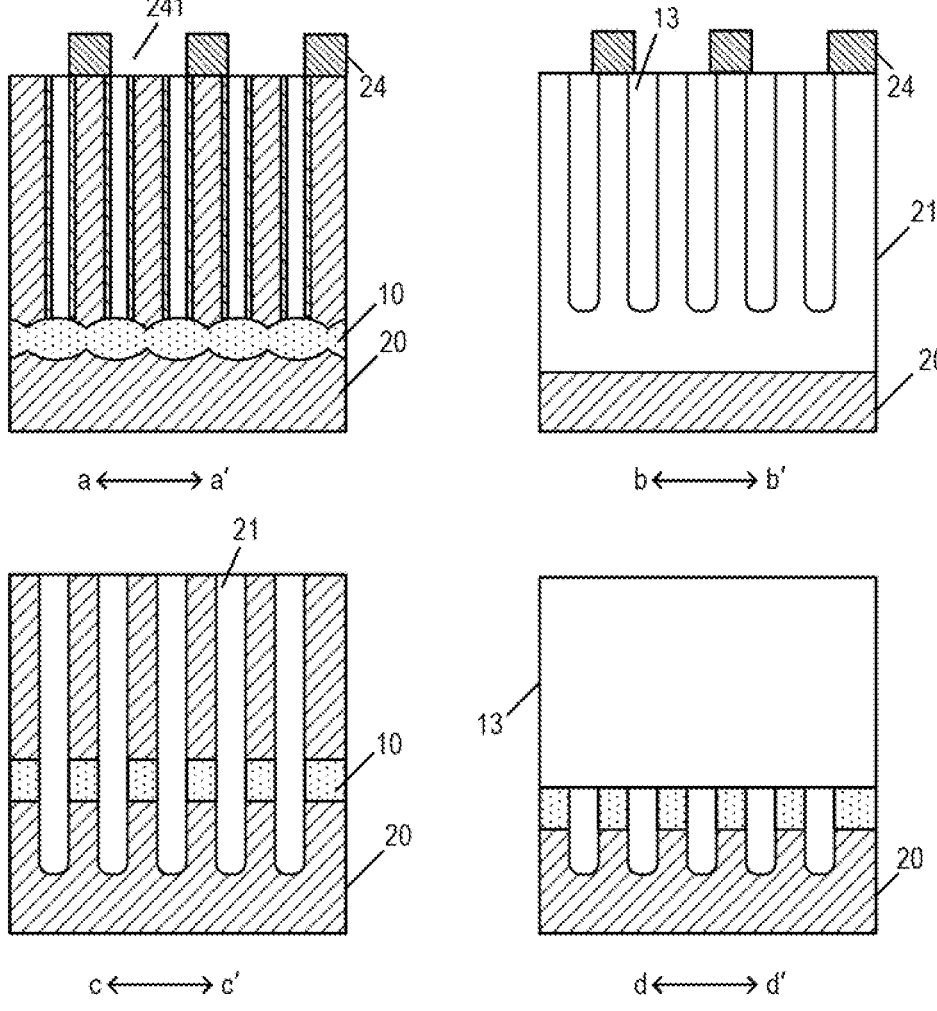
Figure 5G:
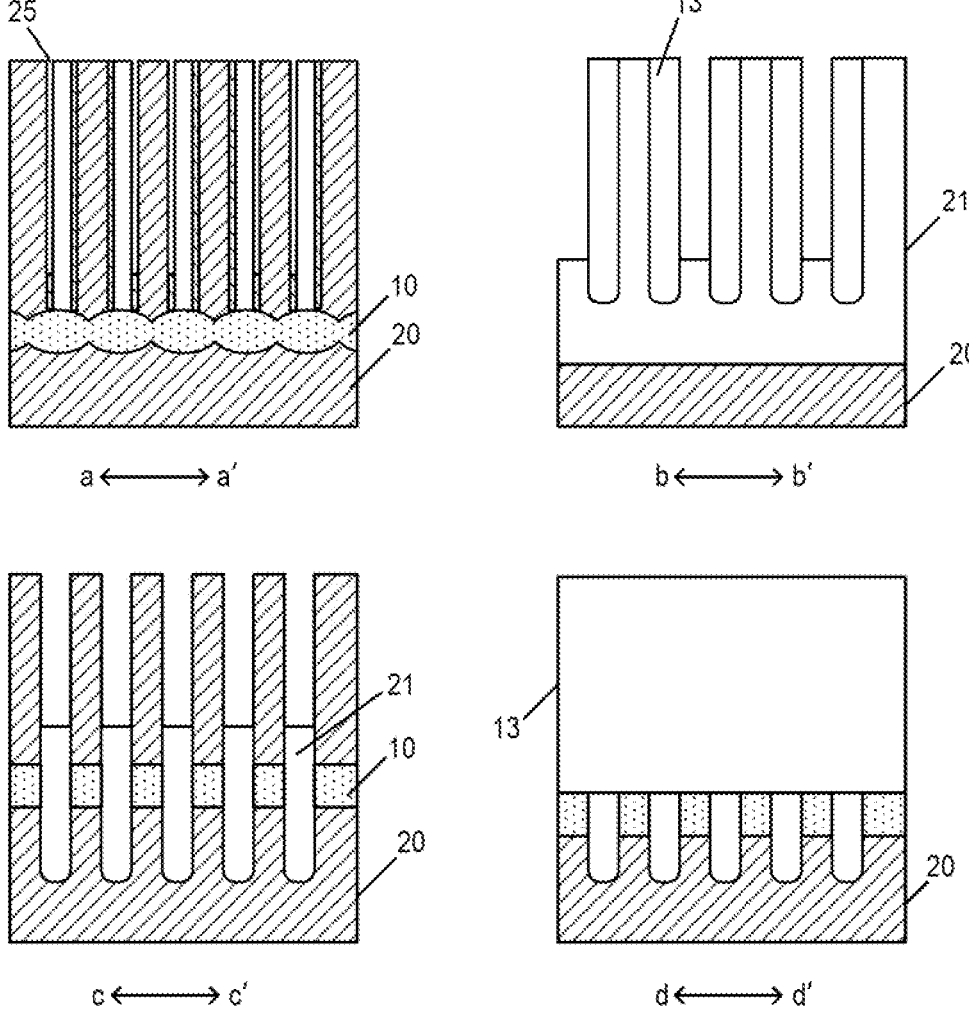
Figure 5H:
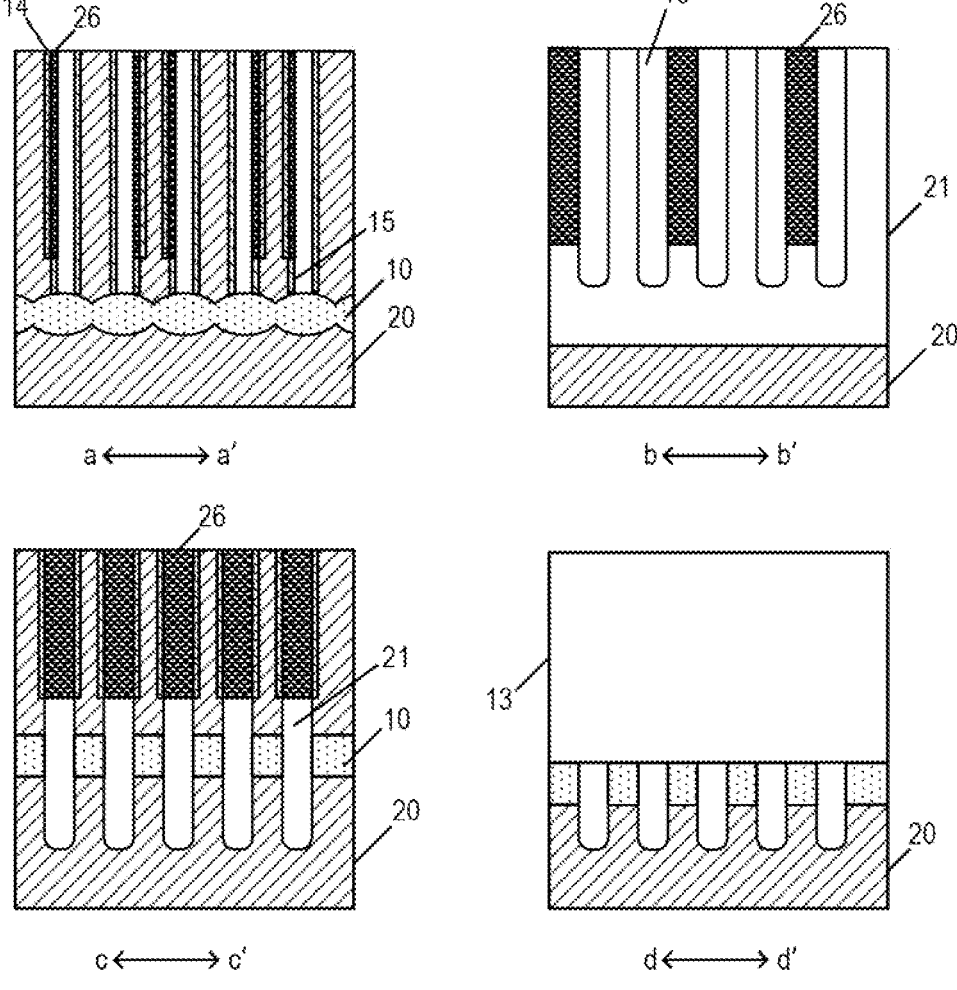
Figure 5I:
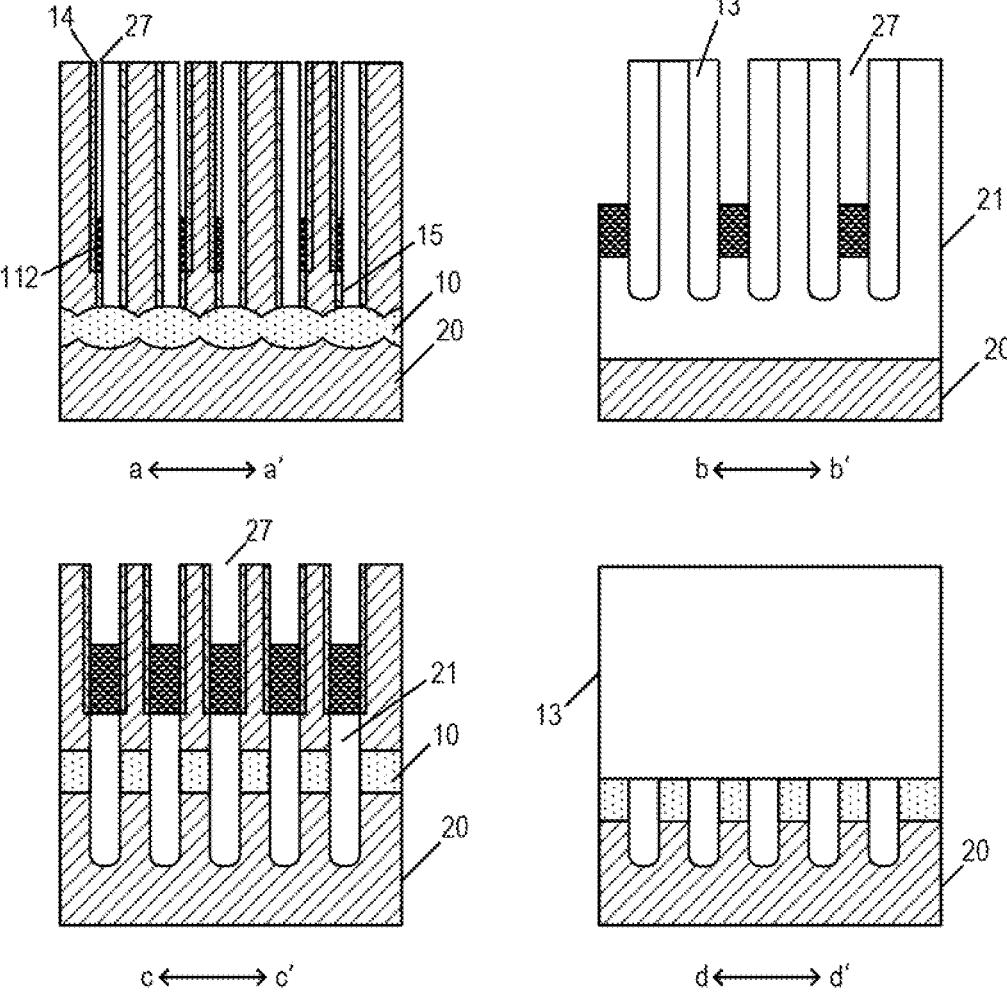
Figure 5J:
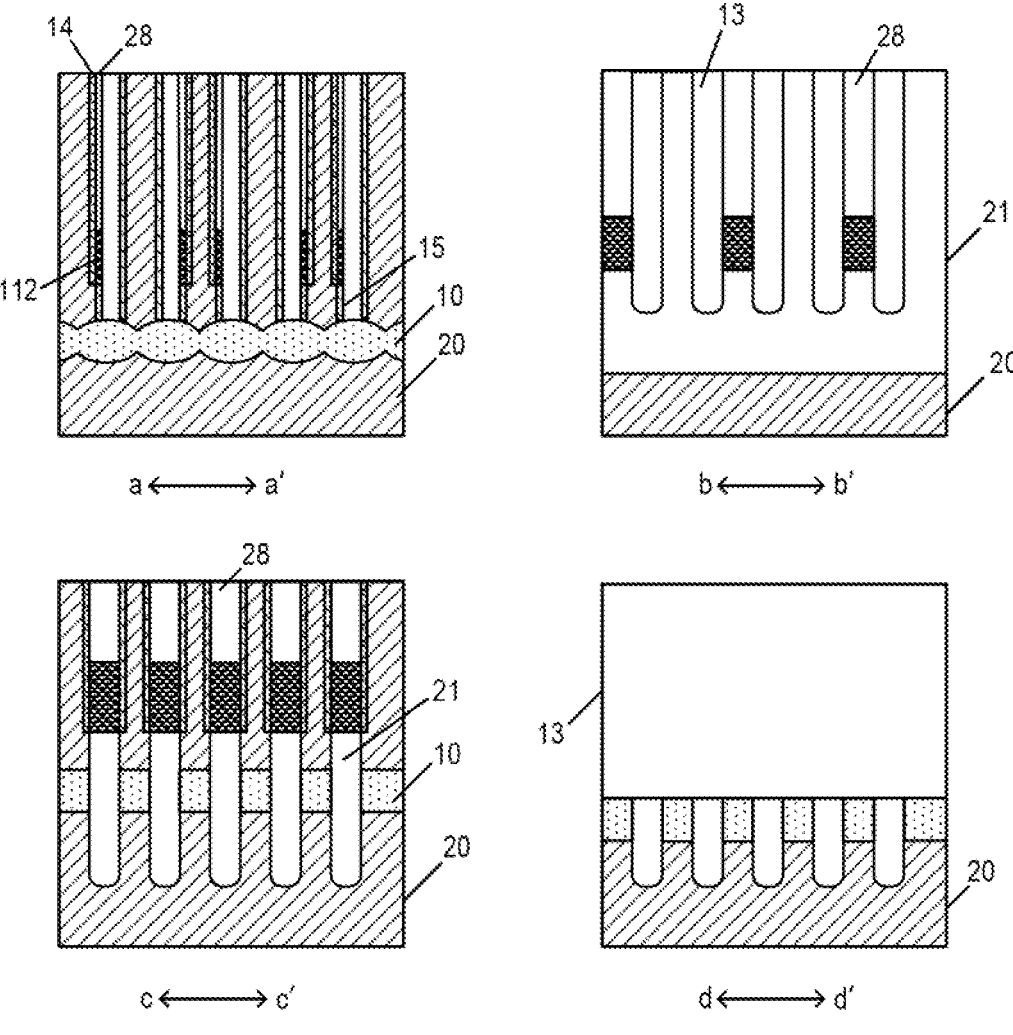

This specific implementation also provides a method for
forming a semiconductor structure. FIG. 3 is a flowchart of
a method for forming a semiconductor structure in a specific
implementation of the disclosure. FIG. 4 is a schematic top
view of a semiconductor structure formed in a specific
implementation of the disclosure. FIGS. 5A-5N are sche-
matic views of a principal process in forming a semicon-
ductor structure according to an embodiment of a specific implementation of the disclosure. FIGS. 6A-6H are sche-
matic views of a principal process in forming a semicon-
ductor structure according to another embodiment of a
specific implementation of the disclosure. FIGS. 5A-5N and
FIGS. 6A-6H show schematic cross-sectional views of a
principal process in forming the semiconductor structure
from four directions a-a', b-b', c-c', and d-d' in FIG. 4,
respectively, to clearly illustrate the formation process of the
semiconductor structure. A schematic view of the semicon-
ductor structure formed in this specific implementation can
be seen in FIGS. 1 and 2. The semiconductor structure in this
specific implementation may be, but is not limited to, a
memory such as a DRAM. As shown in FIGS. 3-4, FIGS.
5A-5N and FIGS. 6A-6H, a method for forming a semicon-
ductor structure includes S31 to S33.

In S31, a substrate 20 is provided, as shown in FIG. 5A.

For example, the substrate 20 may be, but is not limited
to, a silicon substrate. This specific implementation will be
described by taking the substrate being a silicon substrate as
an example. In other embodiments, the substrate 20 may
also be a semiconductor substrate such as gallium nitride
substrate, gallium arsenide substrate, gallium carbide sub-
strate, silicon carbide substrate, or SOI substrate. The sub-
strate 20 includes the top surface 201, and a bottom surface
202 opposite to the top surface.

In S32, multiple active pillars 12 arranged in an array in
a first direction a-a' and a second direction c-c' are formed
in the substrate 20. The first direction a-a' and the second
direction c-c' are both directions parallel to a top surface 201
of the substrate 20, and the first direction a-a' and the second
direction c-c' intersect.

In some embodiments, forming the multiple active pillars
12 in the substrate 20 includes the following operations. The
substrate 20 is etched to form multiple first trenches spaced
apart in the second direction c-c', each of the first trenches
extending in a third direction b-b'. A first filling layer 21
fully filling the multiple first trenches is formed, as shown in
FIG. 5B. The substrate 20 is etched to form multiple second
trenches 23 spaced apart in the first direction a-a', each of the
second trenches extending in a fourth direction d-d', as
shown in FIG. 5C. Thus, the first trenches and the second
trenches intersect to define multiple active pillars 12, as
shown in FIG. 5C. The third direction b-b' is parallel to the
first direction a-a' and the fourth direction d-d' is parallel to
the second direction c-c'. Therefore, each of the first trenches
extends in the first direction a-a' and each of the second
trenches extends in the second direction c-c'.

For example, the first trenches each isolating adjacent bit
lines may be formed by etching the substrate 20 in the
direction perpendicular to the top surface 201 of the sub-
strate 20 using a Self-aligned Double Patterning (SADP)
process or a Self-aligned Quadruple Patterning (SAQP)
process in combination with a dry etching process. The
multiple first trenches are spaced apart in the second direc-
tion c-c', and each of the first trenches extends in the first
direction a-a'. Thereafter, an insulating material such as an
oxide material (e.g. silicon dioxide) is deposited in the first
trench to form the first filling layer 21, as shown in FIG. 5B.
The first filling layer 21 is subsequently configured to
electrically isolate the adjacent bit lines. Next, a patterned
first mask layer 22 is formed on the top surface 201 of the
substrate 20, and the substrate 20 is further etched down
along the first mask layer 22 to form the second trenches 23
each isolating the adjacent word lines, as shown in FIG. 5C.
Since the subsequently formed bit lines are located below
the word lines, in order to facilitate subsequent sufficient
isolation of the adjacent bit lines, in an embodiment, a depth of the first trench is greater than a depth of the second trench 23 in the direction perpendicular to the top surface 201 of the substrate 20 (i.e. the bottom surface of the second trench 23 is located below the bottom surface of the first trench).

In some embodiments, after forming the multiple active pillars 12 and before forming the multiple word lines, the method further includes: forming an insulating layer 15 covering top surfaces and side surfaces of the multiple active pillars 12; and forming multiple bit lines 10 in the substrate 20. The multiple bit lines 10 are spaced apart in the second direction c-c'. Each of the bit lines 10 extends in the first direction a-a' and is in contact with and electrically connected to bottoms of the multiple active pillars 12 arranged in the first direction a-a', as shown in FIG. 5D.

In some embodiments, the material of the active pillars 12 is silicon, and the multiple bit lines 10 are formed by a silicide process.

For example, after forming the second trenches 23, the insulating layer 15 covering the top surfaces and the side surfaces of the active pillars 12 is deposited. The material of the insulating layer 15 may be, but is not limited to, an oxide material such as silicon dioxide. The insulating layer 15 is configured to protect the active pillars 12 from being damaged during subsequent formation of the bit lines 10. The substrate 20 then continues to be etched along the second trenches 23 to form bit line grooves below the second trenches 23 and in communication with the second trenches 23. In the first direction a-a', a width of the bit line groove is greater than a width of the second trench 23. A metal layer formed by a material such as titanium, cobalt and nickel is then deposited in the bit line groove, and a silicide process is used to form the bit lines 10 extending in the first direction a-a'.

In S33, multiple word lines spaced apart in the first direction a-a' are formed. Each of the word lines extends in the second direction c-c' and continuously surrounds and covers a portion of a side wall of each of the multiple active pillars 12 arranged in the second direction c-c'. Any two adjacent word lines are at least partially staggered in a direction perpendicular to the top surface 201 of the substrate 20.

In some embodiments, some of the multiple word lines are first word lines 111 and some of the multiple word lines are second word lines 112. As for the multiple active pillars 12 arranged in the first direction a-a', the first word line 111 surrounds and covers a portion of the side wall of the active pillar 12 in a first parity sequence and the second word line 112 surrounds and covers a portion of the side wall of the active pillar 12 in a second parity sequence.

For example, the first parity sequence may be an odd sequence and the second parity sequence may be an even sequence. Accordingly, the expression that the first word line 111 surrounds and covers a portion of the side wall of the active pillar 12 in the first parity sequence and the second word line 112 surrounds and covers a portion of the side wall of the active pillar 12 in the second parity sequence means that, after sequentially ordering the multiple active pillars 12 arranged in the first direction a-a', a portion of the side wall of the active pillar 12 located at an odd position is surrounded and covered by the first word line 111, and a portion of the side wall of the active pillar 12 located at an even position is surrounded and covered by the second word line 112. The first word line 111 and the second word line 112 are at least partially staggered in the direction perpendicular to the top surface 201 of the substrate 20. Of course, the first parity sequence may also be an even sequence and the second parity sequence may also be an odd sequence. For example, projections of the first word lines 111 in the direction perpendicular to the top surface 201 of the substrate 20 may be alternated with projections of the second word lines 112 in the direction perpendicular to the top surface 201 of the substrate 20, thereby helping to simplify the formation process of the word lines and reducing the difficulty of manufacturing the semiconductor structure.

In some embodiments, forming the multiple word lines includes the following operations. An isolating layer 13 fully filling the second trenches 23 and covering a surface of the insulating layer 15 is formed, as shown in FIG. 5E. A portion of the insulating layer 15 is etched to form second grooves 25 each between the active pillar 12 in the second parity sequence and the isolating layer 13, as shown in FIG. 5G. The second word lines 112 in the second grooves 25 are formed, as shown in FIG. 5I. A portion of the insulating layer 15 is etched to form first grooves 30 each between the active pillar 12 in the first parity sequence and the isolating layer 13, the first groove 30 and the second groove 25 having different depths, as shown in FIG. 5L. The first word lines 111 located in the first grooves 30 are formed. The second word line 12 and the first word line 111 are staggered in the direction perpendicular to the top surface 201 of the substrate 20.

In some embodiments, forming the second word lines 112 located in the second grooves 25 includes the following operations. Initial second word lines 26 fully filling the second grooves 25 are formed, as shown in FIG. 5H. A portion of each of the initial second word lines 26 is etched back to form the second word lines 112 and third grooves 27 located above the second word lines 112, as shown in FIG. 5I. A second filling layer 28 fully filling the third grooves 27 is formed, as shown in FIG. 5J.

In some embodiments, forming the first word lines 111 located in the first grooves 30 includes the following operations. Initial first word lines fully filling the first grooves 30 are formed. A portion of each of the initial first word lines is etched back to form the first word lines Ill and fourth grooves 31 located above the first word lines 111, as shown in FIG. 5M. A third filling layer 32 fully filling the fourth grooves 31 is formed, as shown in FIG. 5N.

For example, in some embodiments, an insulating material such as nitride (e.g. silicon nitride) may be deposited in the second trench 23 using a chemical vapor deposition process, a physical vapor deposition process, or an atomic layer deposition process to form the isolating layer 13, so as to obtain the structure as shown in FIG. 5E after Chemical Mechanical Polishing (CMP). Thereafter, a second mask layer 24 is formed on the top surface 201 of the substrate 20, as shown in FIG. 5F. The second mask layer 24 is provided with first etching windows 241 therein, exposing part of the insulating layer 15, at least part of the isolating layer 13, and the top surfaces of the multiple active pillars 12 arranged in the second parity sequence. The material of the second mask layer 24 may be an organic mask material such as carbon. Next, the part of the insulating layer 15 is etched down along the first etching windows 241 using a selective wet etching process to form second grooves 25 each between the active pillar 12 in the second parity sequence and the isolating layer 13, as shown in FIG. 5G. Thereafter, the side walls of the second grooves 25 are oxidized using an in-situ oxidation process to form a gate dielectric layer 14 on the side surfaces of multiple active pillars 12 arranged in the second parity sequence. A conductive material such as TiN is deposited in the second grooves 25 using a method such as atomic layer deposition to form the initial second word lines 26 fully filling the second grooves 25 and covering the side wall of the gate dielectric layer 14 and the side wall of the isolating layer 13, so as to form the structure as shown in FIG. 5H after the CMP process. A portion of each of the initial second word lines 26 is then etched back to form the second word lines 112 and third grooves 27 located above the second word lines 112, as shown in FIG. 5I. Thereafter, an insulating material such as nitride (e.g. silicon nitride) is filled in the third grooves 27, and after CMP, the second filling layer 28 is formed as shown in FIG. 5J.

Figure 5K:
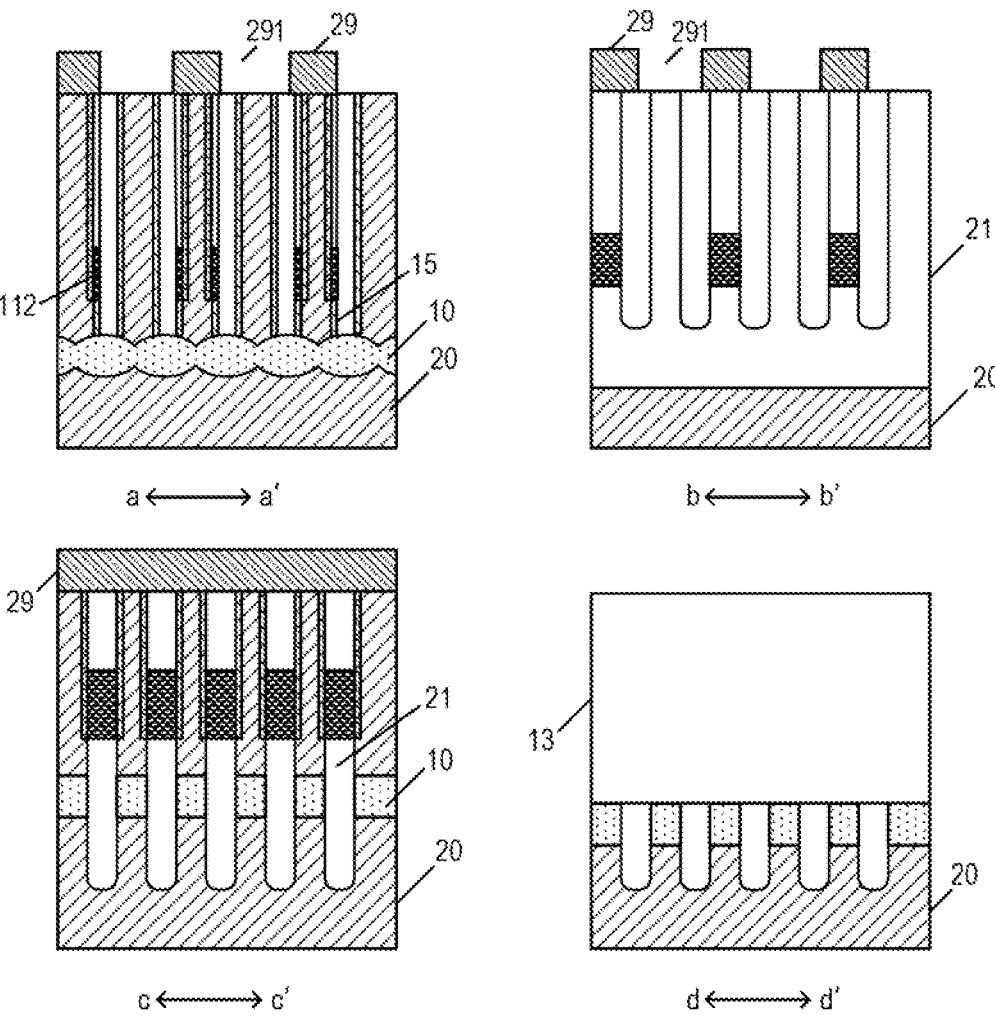
Figure 5L:
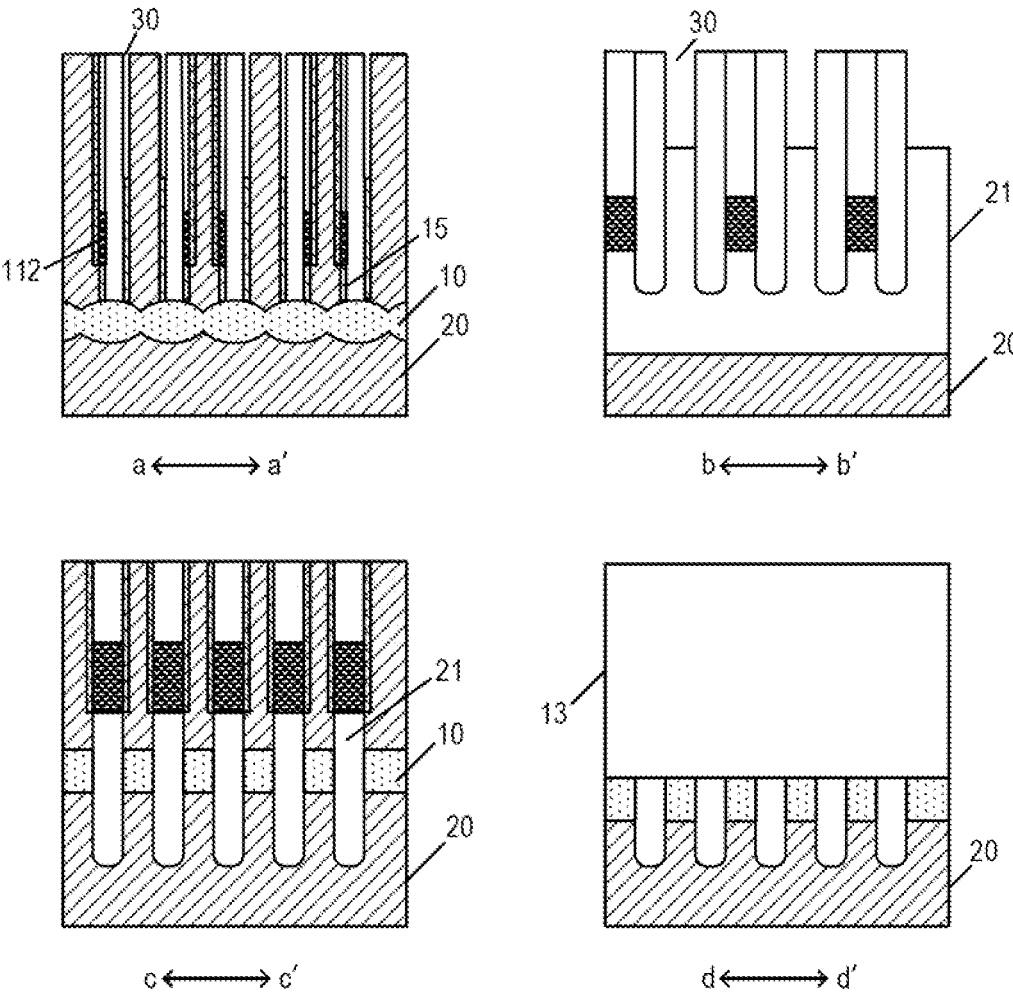
Figure 5M:
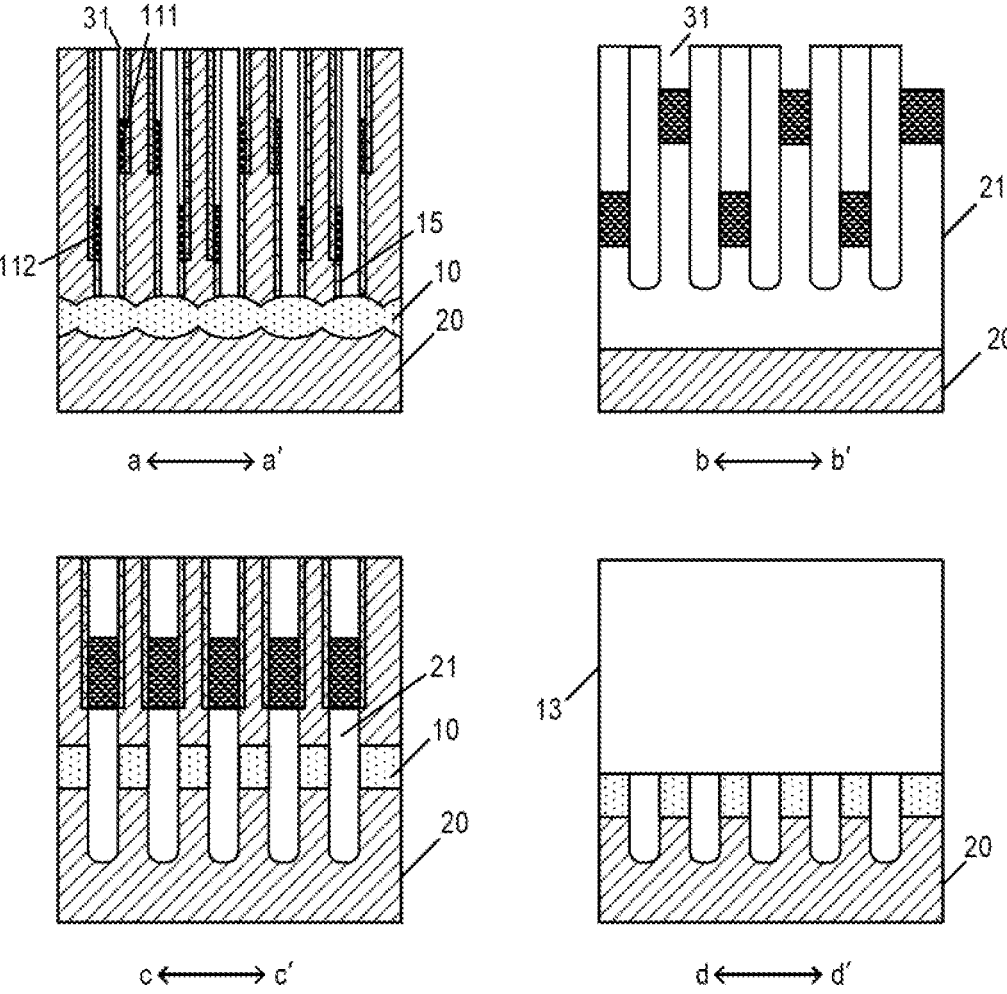
Figure 5N:
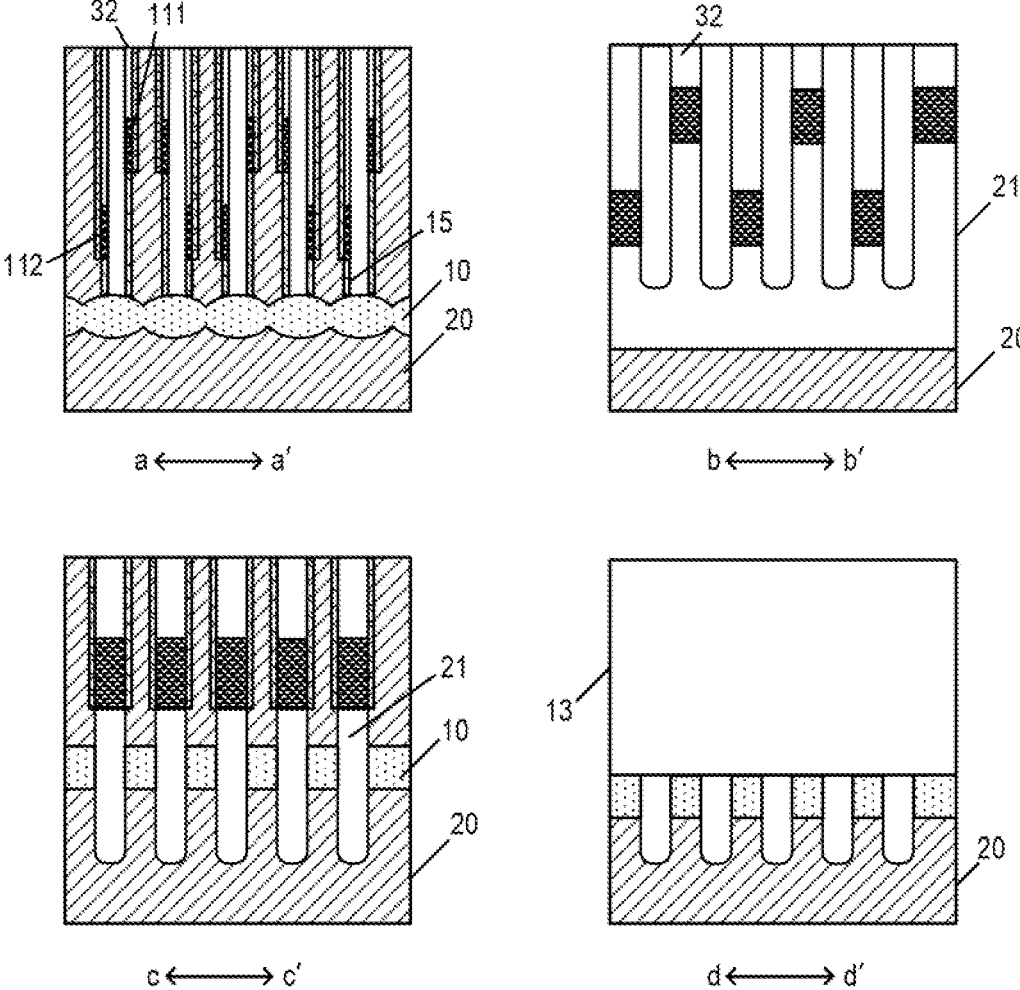

Next, a third mask layer 29 is formed on the top surface of the substrate 20, as shown in FIG. 5K. The third mask layer 29 is provided with second etching windows 291 therein, exposing part of the insulating layer 15, at least part of the isolating layer 13, and the top surfaces of the multiple active pillars 12 arranged in the first parity sequence. Next, the part of the insulating layer 15 is etched down along the second etching windows 291 using a selective wet etching process to form first grooves 30 each between the active pillar 12 in the first parity sequence and the isolating layer 13, as shown in FIG. 5L. Thereafter, the side walls of the first grooves 30 are oxidized using an in-situ oxidation process to form the gate dielectric layer 14 on the side surfaces of the multiple active pillars 12 arranged in the first parity sequence. A conductive material such as TiN is deposited in the first grooves 30 using a method such as atomic layer deposition to form the initial first word lines fully filling the first grooves 30 and covering the side wall of the gate dielectric layer 14 and the side wall of the isolating layer 13. The top surface of the initial first word line is flush with the top surface of the isolating layer 13 after the CMP process. A portion of each of the initial first word lines is then etched back to form the first word lines 111 and fourth grooves 31 located above the first word lines 111, as shown in FIG. 5M. Thereafter, an insulating material such as nitride (e.g. silicon nitride) is filled in the fourth grooves 31, and after CMP, the third filling layer 32 is formed as shown in FIG. 5N.

In some embodiments, a bottom surface of the first groove 30 is located above a bottom surface of the second groove 25, and the bottom surface of the first groove 25 is located below a top surface of the second word line 112, whereby the bottom surface of the first word line 111 formed is located above the bottom surface of the second word line 112, and the bottom surface of the first word line Ill is located below the top surface of the second word line 112, i.e. the first word line 111 and the second word line 112 only partially overlap. In other embodiments, the bottom surface of the first groove 25 is located above the top surface of the second word line 112, whereby the bottom surface of the first word line is located above the bottom surface of the second word line 112, i.e. the first word line 111 and the second word line 112 do not overlap.

Figure 6A:
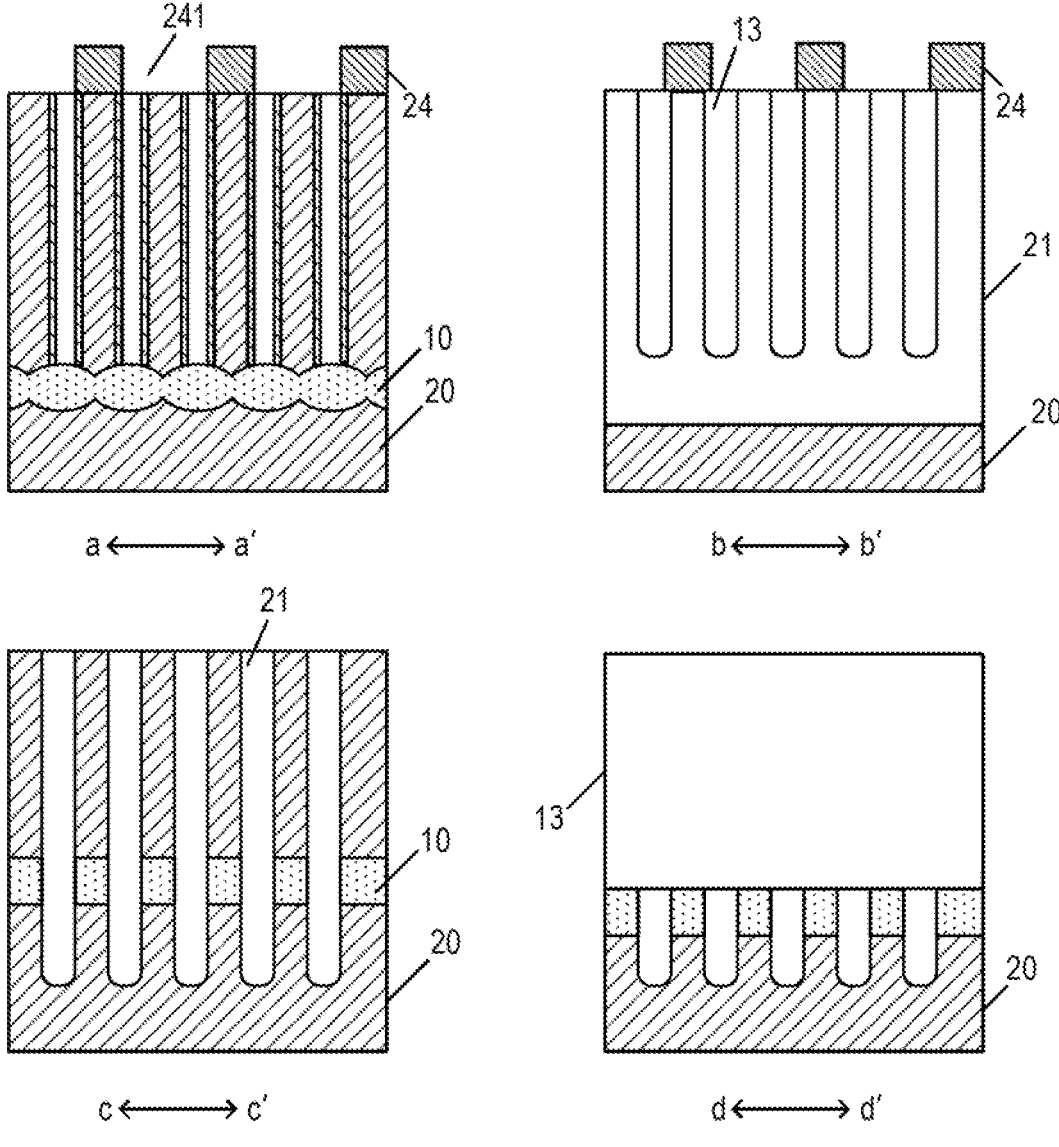
FIGS. 6A-6H are schematic views of a principal process in forming a semiconductor structure according to another embodiment of a specific implementation of the disclosure.
Figure 6B:
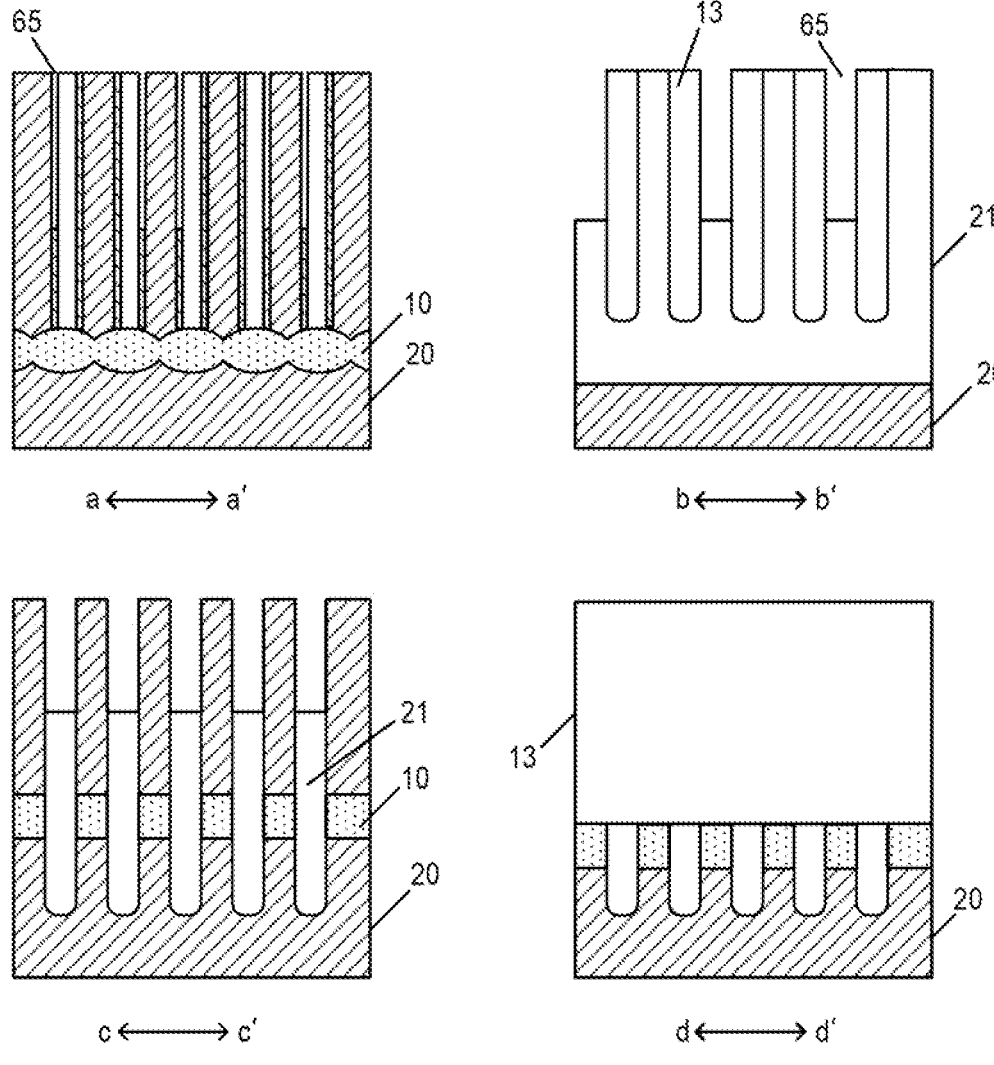
Figure 6C:
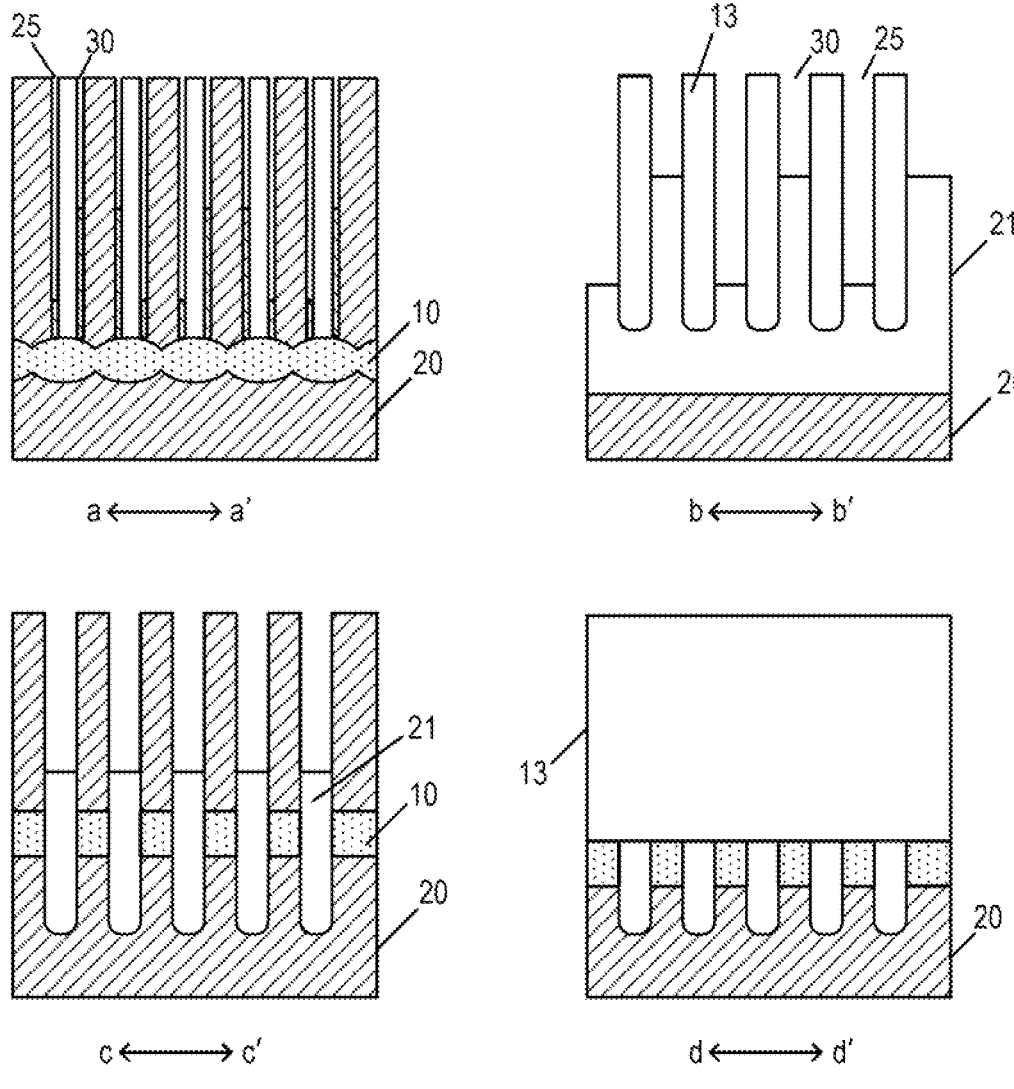
Figure 6D:
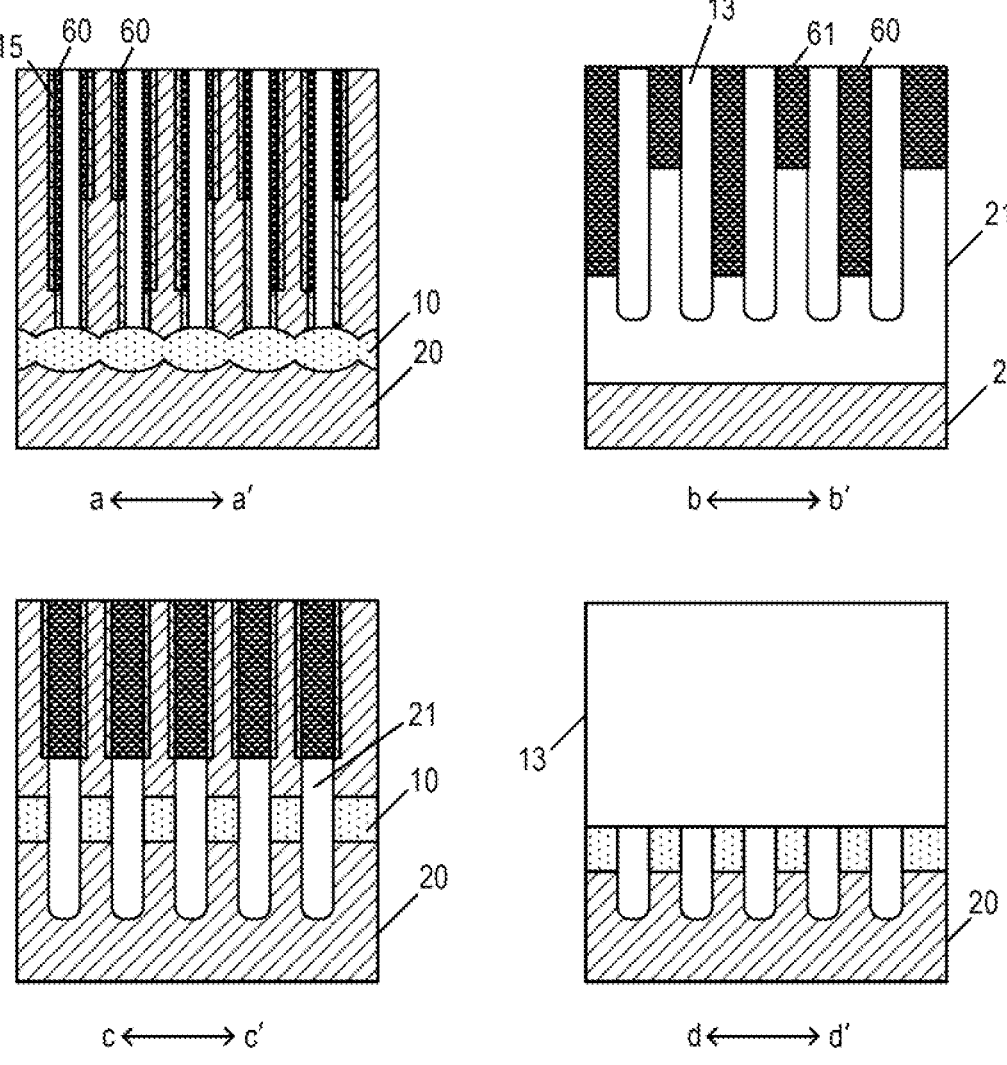
Figure 6E:
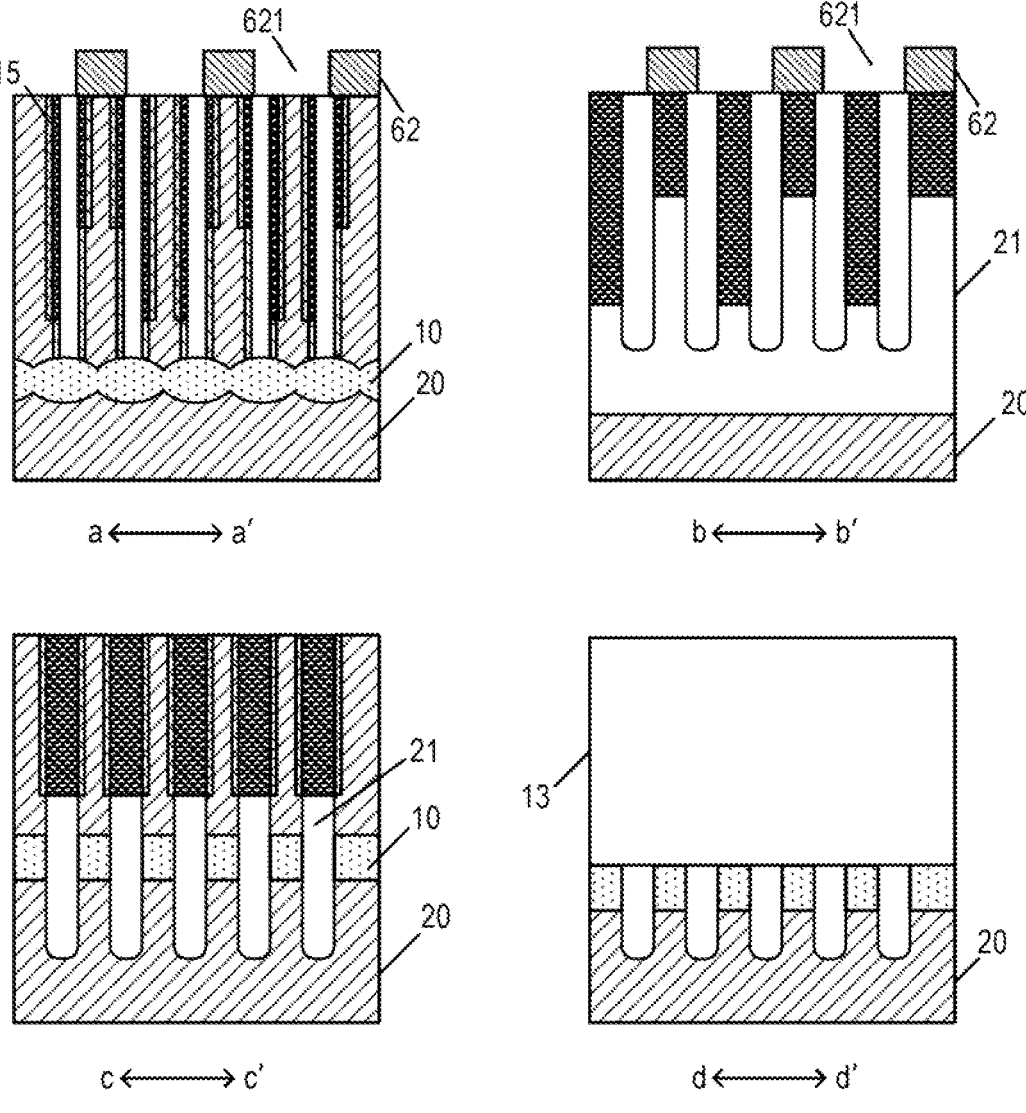
Figure 6F:
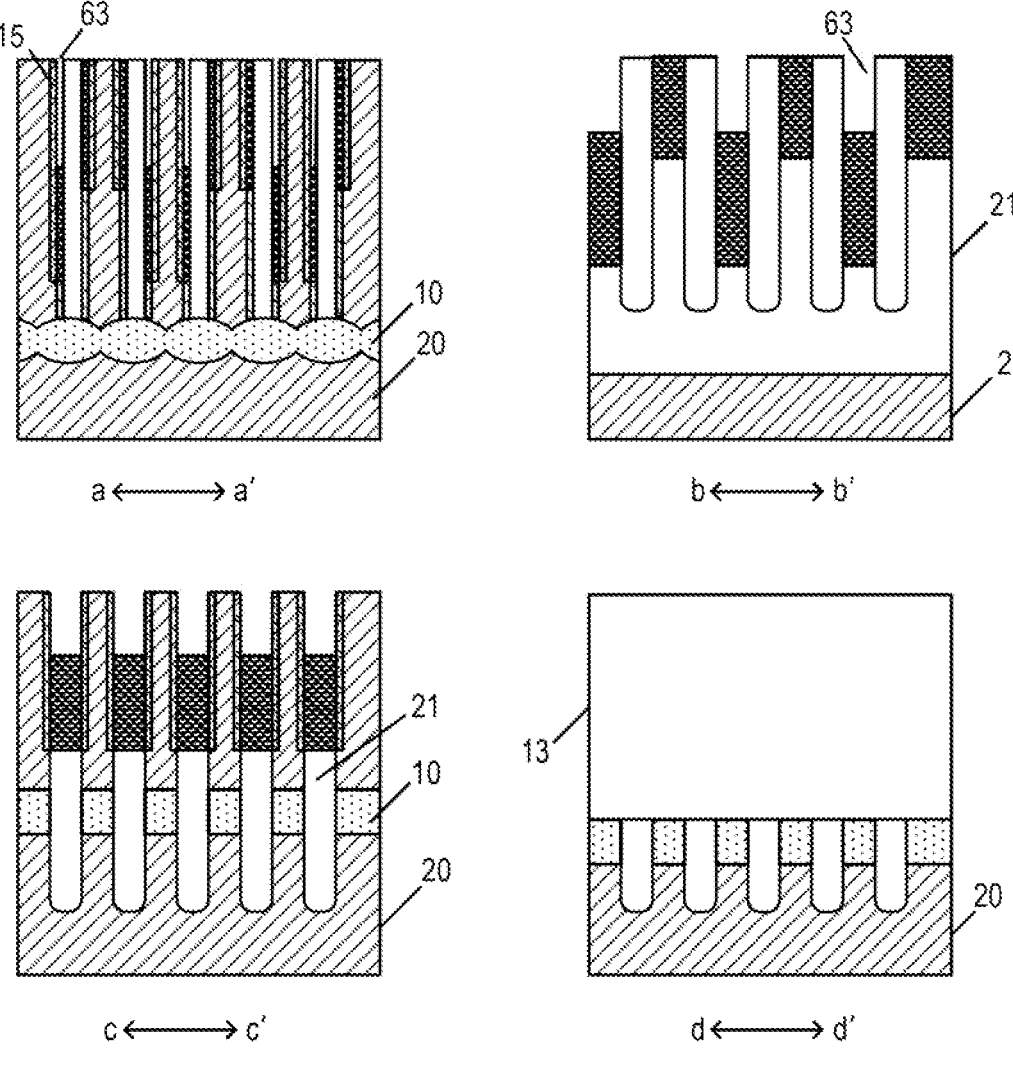
Figure 6G:
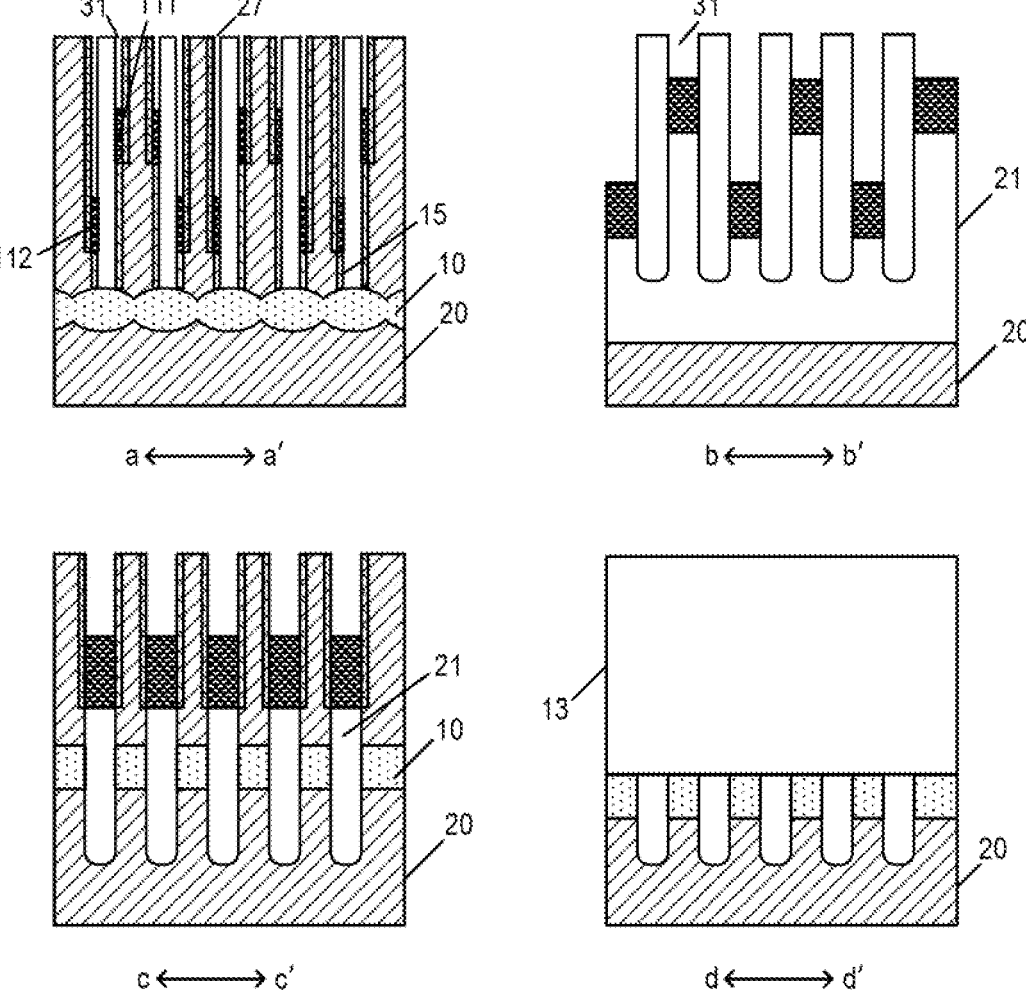
Figure 6H:
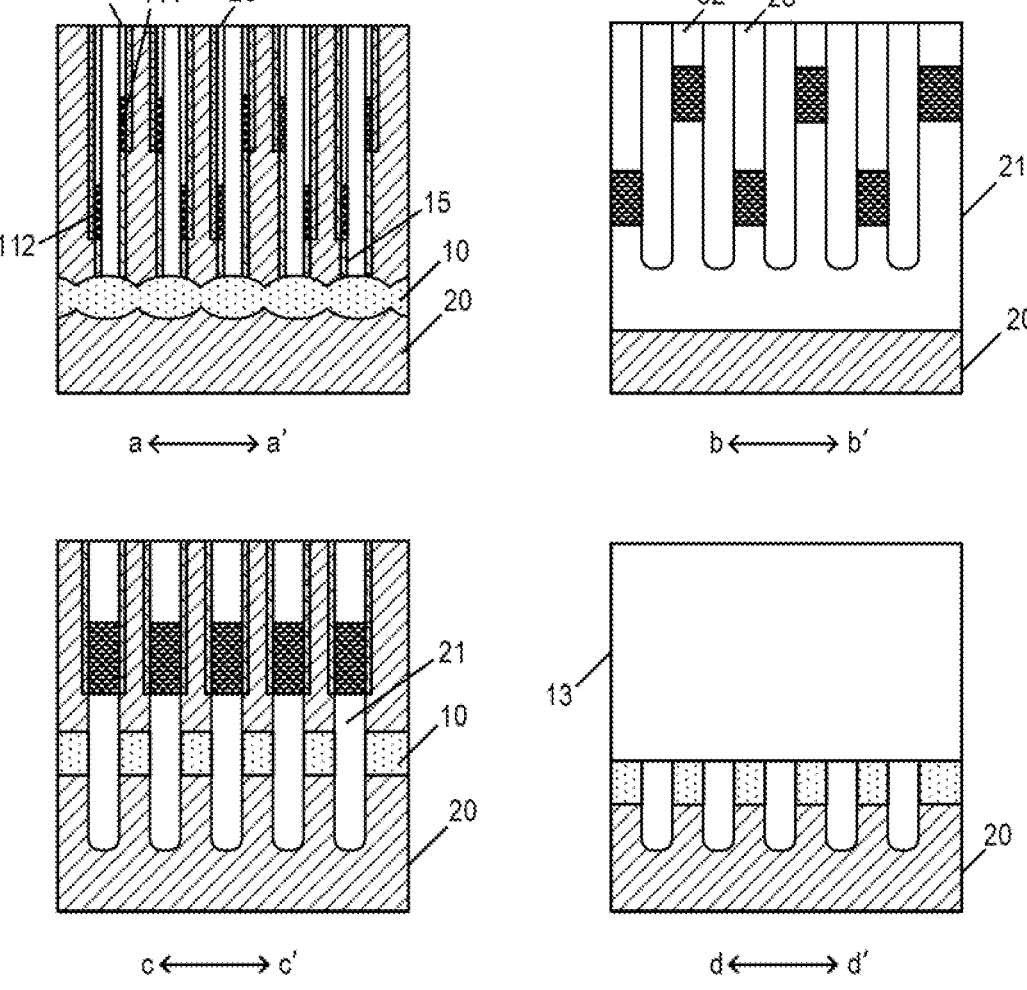

In other embodiments, forming the multiple word lines includes the following operations. An isolating layer 23 fully filling the second trenches 23 and covering a surface of the insulating layer 15 is formed. The insulating layer 23 is etched to form second grooves 25 each between the active pillar 12 in the second parity sequence and the isolating layer 23 and first grooves 30 each between the active pillar 12 in the first parity sequence and the isolating layer 23, the first groove 30 and the second groove 25 having different depths, as shown in FIG. 6C. Second word lines 112 are formed in the second grooves 25 and first word lines 111 are formed in the first grooves 30, the second word line 112 and the first word line 111 being staggered in the direction perpendicular to the top surface 201 of the substrate 20, as shown in FIG. 6G.

In some embodiments, forming the second grooves 25 each between the active pillar 12 in the second parity sequence and the isolating layer 23 and the first grooves 30 each between the active pillar 12 in the first parity sequence and the isolating layer 23 includes the following operations. The insulating layer 15 between the active pillar 12 in the second parity sequence and the isolating layer 23 is etched to form initial second grooves 65, as shown in FIG. 6B. The insulating layer 15 between the active pillar 12 in the first parity sequence and the isolating layer 23 and the insulating layer 15 below the initial second grooves 65 are etched, so as to form the first grooves 30 and the second grooves 25 respectively, as shown in FIG. 6C.

In some embodiments, forming the first word lines 111 in the first grooves 30 and the second word lines 112 in the second grooves 25 includes the following operations. A conductive material layer 60 fully filling the first grooves 30 and the second grooves 25 is formed. The conductive material layer 60 in the second grooves 25 is etched back. The conductive material layer 60 in the second grooves 25 is etched back again and the conductive material layer 60 in the first grooves 30 is etched back. The conductive material layer 60 retained in the second grooves 25 forms the second word lines 112 and the conductive material layer 60 retained in the first grooves 30 forms the first word lines 111.

For example, in other embodiments, an insulating material such as nitride (e.g. silicon nitride) may be deposited in the second trench 23 using a chemical vapor deposition process, a physical vapor deposition process, or an atomic layer deposition process to form the isolating layer 13. The top surface of the isolating layer 13 is flush with the top surface of the active pillar 12 after CMP. Thereafter, a second mask layer 24 is formed on the top surface 201 of the substrate 20, as shown in FIG. 6A. The second mask layer 24 is provided with first etching windows 241 therein exposing part of the insulating layer 15, at least part of the isolating layer 13, and the top surfaces of the multiple active pillars 12 arranged in the second parity sequence. The material of the second mask layer 24 may be an organic mask material such as carbon. Next, the part of the insulating layer 15 is etched down along the first etching windows 241 using a selective wet etching process to form initial second grooves 65 each between the active pillar 12 in the second parity sequence and the isolating layer 13, as shown in FIG. 6B. Next, the second mask layer 24 is removed. The insulating layer 15 between the active pillar 12 in the first parity sequence and the isolating layer 23 is etched using a selective wet etching process, and the insulating layer 15 below the initial second grooves 65 is continuously etched to form the first grooves 30 and the second grooves 25, respectively, as shown in FIG. 6C. Thereafter, the side walls of the first grooves 30 and the side walls of the second grooves 25 are oxidized using an in-situ oxidation process to form a gate dielectric layer 14 on the side surfaces of the multiple active pillars arranged in the first parity sequence and the side surfaces of the multiple active pillars 12 arranged in the second parity sequence.

A conductive material such as TiN is simultaneously deposited in the first grooves 30 and the second grooves 25 to form the conductive material layer 60 fully filling the first grooves 30 and the second grooves 25. After CMP, the top surface of the conductive material layer 60 is flush with the top surface of the active pillar 12, as shown in FIG. 6D. Next, a fourth mask layer 62 is formed on the top surface 201 of the substrate 20. The fourth mask layer 62 is provided with third etching windows 621 therein exposing the multiple active pillars 12, part of the conductive material layer 60, and at least part of the isolating layer 23 arranged in the second parity sequence, as shown in FIG. 6E. A portion of the conductive material layer 60 in the second grooves 25 is etched back along the third etching windows 621 to form fifth grooves 63 in the second grooves 25, as shown in FIG. 6F. Thereafter, the conductive material layer 60 in the first grooves 30 is etched back while continuing to etch the conductive material layer 60 below the fifth grooves 63 to form the first word lines Ill at the bottom of the first grooves 30, the fourth grooves 31 above the first word lines 111, the second word lines 112 at the bottom of the second grooves 25, and the third grooves 27 above the second word lines 112, as shown in FIG. 6G. Thereafter, an insulating material such as nitride (e.g. silicon nitride) is simultaneously deposited in the fourth grooves 31 and the third grooves 27, a second filling layer 28 is formed in the third grooves 27, and a third filling layer 32 is formed in the fourth grooves 31.

Some embodiments of this specific implementation of the disclosure provide a semiconductor structure and a method for forming a semiconductor structure. Any two adjacent word lines are controlled to be at least partially staggered in a direction perpendicular to a top surface of a substrate such that any two adjacent word lines is at different levels, thereby reducing the facing area between the adjacent word lines, so as to reduce the effect of capacitive coupling between two adjacent word lines. In addition, the disclosure only needs to adjust the number of etching processes, so that any two adjacent word lines can be at least partially staggered, the manufacture process is simple, and the semiconductor structure is easy to implement and control.

The above description is a preferred implementation of the disclosure. It is to be noted that a number of modifications and refinements may be made by those ordinarily skilled in the art without departing from the principles of the disclosure, and such modifications and refinements are also considered to be within the scope of protection of the disclosure.

The invention claimed is:

1. A semiconductor structure, comprising:
a substrate;
a plurality of active pillars located in the substrate, the plurality of active pillars being arranged in an array in a first direction and a second direction, wherein the first direction and the second direction are both directions parallel to a top surface of the substrate, and the first direction and the second direction intersect; and
a plurality of word lines spaced apart in the first direction, each of the plurality of word lines extending in the second direction and continuously surrounding and covering a portion of a side wall of each of a plurality of active pillars arranged in the second direction, and any two adjacent word lines being at least partially staggered in a direction perpendicular to the top surface of the substrate;
wherein each of the plurality of active pillars comprises a source region, a channel region and a drain region sequentially arranged in the direction perpendicular to the top surface of the substrate, each of the plurality of word lines continuously surrounds and covers the channel regions of the plurality of active pillars arranged in the second direction, and the semiconductor structure further comprises:
a plurality of bit lines located in the substrate, the plurality of bit lines being spaced apart in the second direction, each of the bit lines extending in the first direction and being in contact with and electrically connected to the source regions of the plurality of active pillars arranged in the first direction;
an insulating layer, covering a side wall of the source region;
a gate dielectric layer, covering a side wall of the channel region and a side wall of the drain region, wherein each of the plurality of word lines is located on a surface of the gate dielectric layer on the channel region; and
an isolating layer, located between adjacent active pillars and covering a surface of the insulating layer, a surface of the word line and a surface of the gate dielectric layer on the side wall of the drain region.

2. The semiconductor structure according to claim 1, wherein part of the plurality of word lines are first word lines and part of the plurality of word lines are second word lines; and
as for the plurality of active pillars arranged in the first direction, the first word line surrounds and covers a portion of the side wall of the active pillar in a first parity sequence, and the second word line surrounds and covers a portion of the side wall of the active pillar in a second parity sequence.

3. The semiconductor structure according to claim 2, wherein a top surface of the first word line is located below a bottom surface of the second word line; or,
a top surface of the first word line is located above a bottom surface of the second word line, and the top surface of the first word line is located below a top surface of the second word line.

4. The semiconductor structure according to claim 2, wherein a top surface of the first word line is located below a bottom surface of the second word line, a preset gap is provided between the top surface of the first word line and the bottom surface of the second word line, and a width of the preset gap is $\frac{1}{4}$ to $\frac{1}{2}$ of a size of the first word line in the direction perpendicular to the top surface of the substrate.

5. The semiconductor structure according to claim 1, wherein the plurality of word lines are all equal in size in the direction perpendicular to the top surface of the substrate.

6. The semiconductor structure according to claim 1, wherein part of the plurality of word lines are first word lines, part of the plurality of word lines are second word lines, and part of the plurality of word lines are third word lines; and
as for a plurality of active pillars arranged in the first direction, the first word line surrounds and covers a portion of the side wall of the active pillar at a (3n)-th position, the second word line surrounds and covers a portion of the side wall of the active pillar at a (3n+1)-th position, and the third word line surrounds and covers a portion of the side wall of the active pillar at a (3n+2)-th position, where n is an integer greater than or equal to 0.

* * * * *